(12) United States Patent
Pagani

(10) Patent No.: US 9,823,300 B2
(45) Date of Patent: Nov. 21, 2017

(54) PROCESS FOR CONTROLLING THE CORRECT POSITIONING OF TEST PROBES ON TERMINATIONS OF ELECTRONIC DEVICES INTEGRATED ON A SEMICONDUCTOR AND CORRESPONDING ELECTRONIC DEVICE

(71) Applicant: STMicroelectronics S.r.l., Agrate Brianza (IT)

(72) Inventor: Alberto Pagani, Nova Milanese (IT)

(73) Assignee: STMicroelectronics S.R.L., Agrate Brianza (FR)

( * ) Notice: Subject to any disclaimer, the term of this patent is extended or adjusted under 35 U.S.C. 154(b) by 0 days.

(21) Appl. No.: 14/868,904

(22) Filed: Sep. 29, 2015

(65) Prior Publication Data

US 2016/0018461 A1    Jan. 21, 2016

Related U.S. Application Data

(63) Continuation of application No. 12/974,957, filed on Dec. 21, 2010, now Pat. No. 9,146,273.

(30) Foreign Application Priority Data

Dec. 30, 2009  (IT) .............................. MI2009A2332

(51) Int. Cl.
*G01R 31/20*  (2006.01)
*G01R 31/28*  (2006.01)

(52) U.S. Cl.
CPC ..... *G01R 31/2884* (2013.01); *G01R 31/2889* (2013.01); *G01R 31/2891* (2013.01)

(58) Field of Classification Search
CPC ................ G01R 31/26; G01R 31/2831; G01R 31/2858; G01R 31/2884; G01R 31/2887;
(Continued)

(56) References Cited

U.S. PATENT DOCUMENTS 5,014,003 A    5/1991  Ishikawa
5,065,092 A    11/1991 Sigler
(Continued)

FOREIGN PATENT DOCUMENTS

JP    56088333    7/1981
JP    06045419    2/1994
JP    09107011    4/1997

OTHER PUBLICATIONS

IT Search Report for MI2009A002332 dated Aug. 11, 2010 (3 pages).

(Continued)

*Primary Examiner* — Giovanni Astacio-Oquendo
(74) *Attorney, Agent, or Firm* — Gardere Wynne Sewell LLP

(57) ABSTRACT

An electrical check executed on wafer tests for the correct positioning or alignment of the probes of a probe card on the pads or bumps of the electronic devices integrated on the wafer. A signal is applied to cause a current to circulate in at least part of a seal ring of at least one of the electronic devices. In a case where the current flows between and through multiple electronic devices, the seal rings of those electronic devices are suitably interconnected to each other by electronic structures that extend through the scribe line between electronic devices.

27 Claims, 26 Drawing Sheets

(58) Field of Classification Search
CPC ............ G01R 31/2891; G01R 31/2893; G01R 31/318513; H01L 225/06596; H01L 25/0657
USPC ............. 324/750.16, 757.03, 762.03, 762.06
See application file for complete search history.

(56) References Cited

U.S. PATENT DOCUMENTS

| | | | | |
|---|---|---|---|---|
| 5,542,457 | A * | 8/1996 | Gordon | H05K 13/0491 140/123 |
| 5,548,223 | A * | 8/1996 | Cole | G01R 1/07378 324/754.03 |
| 5,583,445 | A * | 12/1996 | Mullen | G01R 1/0735 324/754.23 |
| 6,943,063 | B2 | 9/2005 | Tsai et al. | |
| 7,061,256 | B2 | 6/2006 | Hasegawa | |
| 7,253,487 | B2 | 8/2007 | Chen | |
| 7,607,586 | B2 * | 10/2009 | Wang | G06K 19/0723 235/468 |
| 7,863,914 | B2 | 1/2011 | Seo et al. | |
| 7,893,459 | B2 | 2/2011 | Wang et al. | |
| 8,153,476 | B2 * | 4/2012 | Kaneda | H03H 3/08 257/E21.596 |
| 8,330,254 | B2 * | 12/2012 | Furumiya | G01R 31/2884 257/400 |
| 8,461,667 | B2 | 6/2013 | Hishida et al. | |
| 9,146,273 | B2 * | 9/2015 | Pagani | G01R 31/2891 |
| 2002/0157082 | A1 * | 10/2002 | Shau | G01R 31/2856 716/50 |
| 2003/0184333 | A1 | 10/2003 | Nagel et al. | |
| 2004/0185682 | A1 * | 9/2004 | Foulke | G03F 1/38 438/800 |
| 2005/0063431 | A1 | 3/2005 | Gallup et al. | |
| 2005/0258854 | A1 | 11/2005 | Kim et al. | |
| 2006/0103408 | A1 | 5/2006 | Takahashi et al. | |
| 2006/0109120 | A1 * | 5/2006 | Burr | G06K 19/0723 340/572.1 |
| 2007/0023915 | A1 | 2/2007 | Jao et al. | |
| 2007/0090851 | A1 | 4/2007 | Kim et al. | |
| 2007/0290709 | A1 | 12/2007 | Takasu | |
| 2008/0277659 | A1 * | 11/2008 | Hsu | H01L 22/34 257/48 |
| 2009/0160470 | A1 | 6/2009 | Reinwald et al. | |
| 2015/0287655 | A1 * | 10/2015 | Killingsworth | H01L 21/768 324/762.02 |

OTHER PUBLICATIONS

Chen, Shih-Hung et al: "Investigation on Seal-Ring Rules for IC Product Reliability in 0.25um CMOS Technology," Microelectronics Reliability 45, 2005 (pp. 1311-1316).

* cited by examiner

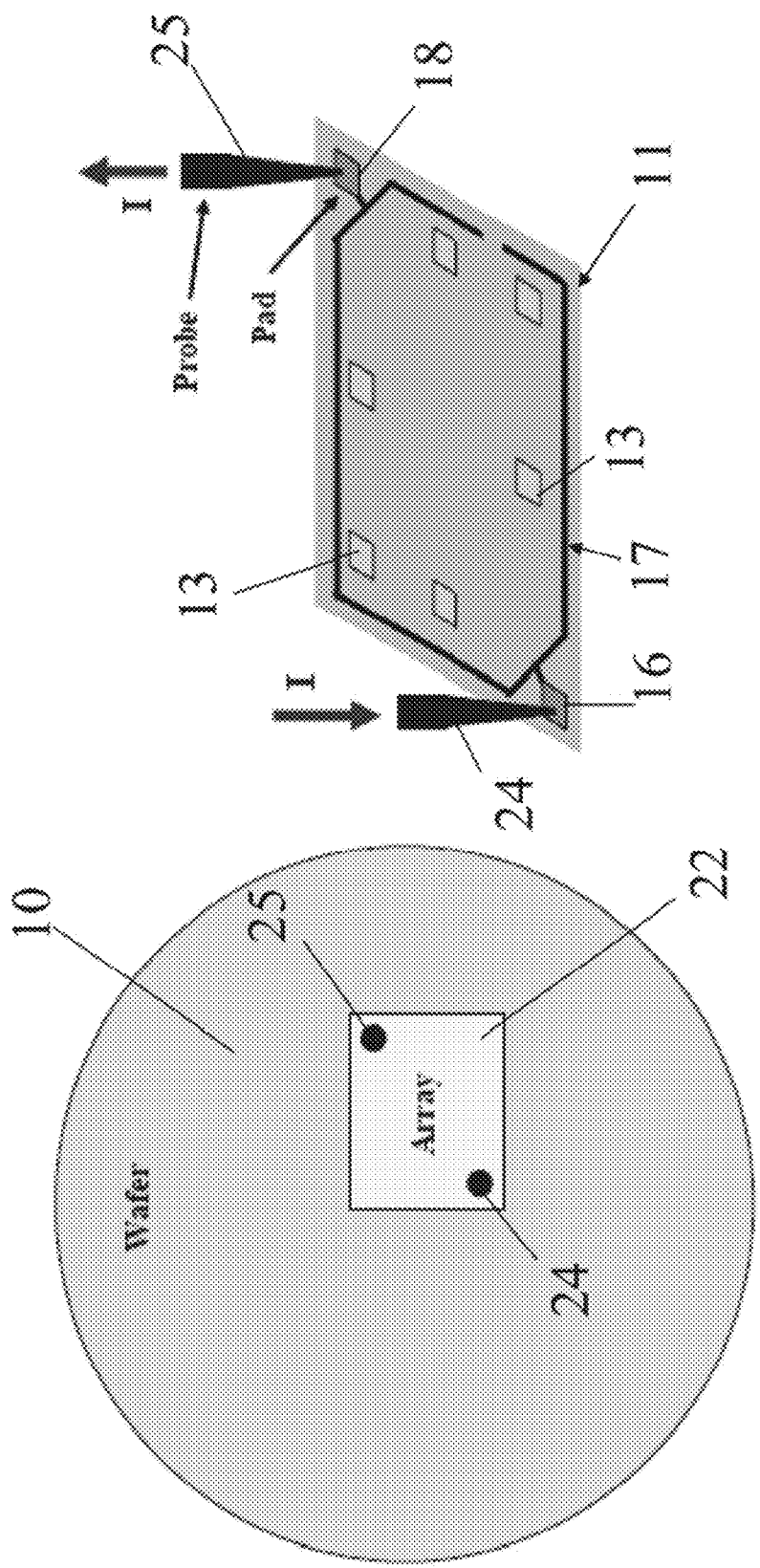

PROCESS FOR CONTROLLING THE CORRECT POSITIONING OF TEST PROBES ON TERMINATIONS OF ELECTRONIC DEVICES INTEGRATED ON A SEMICONDUCTOR AND CORRESPONDING ELECTRONIC DEVICE

CROSS REFERENCE TO RELATED APPLICATIONS

This application is a continuation of U.S. application for patent Ser. No. 12/974,957 filed Dec. 21, 2010, now U.S. Pat. No. 9,146,273, which claims priority to Italian Patent Application No. MI2009A002332, filed Dec. 30, 2009, the foregoing applications incorporated herein by reference in their entireties.

TECHNICAL FIELD

An embodiment relates to a method for checking the correct positioning of test probes on pads of electronic devices integrated on a semiconductor.

An embodiment also relates to an electronic device integrated on a semiconductor wafer and equipped with means for the actuation of the above method.

An embodiment may be applied, in particular, to the process of electric selection of the wafers or testing EWS (Electrical Wafer Sort or more in general Wafer Sort) or for the WLBI (Wafer Level Burn-In) i.e. electric testing that executes the test (also in temperature) with stress on the devices subjected to the test.

BACKGROUND

As it is known in this specific technical field, for the final quality check, a process of electrical sorting of the semiconductor electronic devices is carried out by executing a testing EWS directly on wafer. To this aim it is often necessary to electrically connect a testing apparatus, called tester ATE, that executes the measures on the devices of the wafer.

This situation is schematically shown in FIG. 1.

Between the apparatus ATE and the wafer 1 there is an interface comprising a probe card 2 having an end 3 (probe head) with which also several hundreds (or thousands) of probes 4 are associated that electrically connect the ATE to the almost totality of the pads of the devices to be tested.

In general the wafer is positioned on a support 5 called chuck belonging to an apparatus called prober.

In consequence, the probes 4 of the ATE should be temporarily connected to all the pads 6 of the electronic device to be tested, as shown in FIG. 2, or of the devices since the testing in parallel of several electronic devices simultaneously is more and more frequent.

The number of probes 4 of the resources necessary for the testing may also be smaller or identical to the number of pads 6 present on the device.

In a similar way checks are carried out also on integrated circuits for which it is necessary to contact the respective bumps.

Within this domain it may be very important that the generic probe 4 is well centred on the corresponding pad 6.

Last generation electronic devices have a very high number of pads to be contacted which have a more and more reduced area and are often very close to each other.

In particular the more a pad has a small size, the more probable the breakage of the passivation surrounding the pad is further to an incorrect contact by the relative probe.

It may be very important that all the probes are planar with each other on the vertical axis Z and have a high alignment with respect to the horizontal plane XY. This allows to reduce the damaging problems of the pad and breakages of the passivation.

At present the testing in production of the correct alignment between the generic probe and the pad may be made by observing the signs that the probe leaves on the pad after having contacted it, but this check occurs after having executed the testing step and is not preventive.

FIGS. 3B to 3D show examples of signs left on a pad by the incorrect positioning or alignment of a test probe.

The testing operation may, however, be executed on the prober in a manual way or in an automatic way.

Apparatuses also exist that are different from the prober that test the alignment and the planarity of the probes of the probe card.

However, recently, for meeting the growing requests of electronic applications able to sustain higher and higher temperatures, new materials have been introduced for realizing the end pads of the electronic circuits and for the connections between these pads and the substrate of the package, which is the container of the circuit, so as to ensure a good electric connection.

Some of these materials for the pads are also used to strengthen the pad itself and in consequence these materials have a greater hardness than the materials traditionally used like the aluminum.

This implies that the signs left by the probe may not always be seen on these particular hard materials, even after different mechanical actions of contacting of the probes on the pads.

In consequence, a check in production of the correct centering of the probes on the pads may become difficult, requiring long times and with consequent breakage problems of the passivation that implies the production performance loss with a consequent economic damage.

The adoption of pads realized with hard metals thus may make it difficult to execute a process of reliable probing and in consequence it is possible to lose production electric performance with a consequent increase of the costs.

Production problems are added to all this, these problems further burdening the costs in case, for example, testing problems of a non-immediate solution arise, such as for example a bad electric contact between the probe and the pad.

SUMMARY

An embodiment is a process for checking the correct positioning of test probes on pads of electronic devices integrated on semiconductor having such functional characteristics as to allow to execute this check in a completely automatic way and by means of an electric testing, devices provided with pads realized with hard metals being also present.

An embodiment is based on the assumption that it is not possible to visually value the correct alignment between a generic probe and its corresponding pad; therefore, it has been thought to execute a check of the probing process counting on a methodology of the electric type.

An embodiment for checking the correct positioning of test probes on pads of electronic devices integrated on semiconductor wafer, in which a plurality of said probes associated with an interface of a testing apparatus are guided mutually approaching and departing from said pads of the electronic device/s for executing quality checks based on electric tests, includes at least one control probe chosen in said plurality of probes being put into contact with a corresponding additional control pad of the device subjected to the testing for executing a preliminary electric test and deriving an estimate of alignment or correct positioning of the other probes with the corresponding pads.

The preliminary electric test and contact step may be executed by means of a pair of control probes on a corresponding pair of additional control pads.

The control probes may be put into contact with the additional control pads prior to other probes and simultaneously with them.

The probes of said pair of control probes may be put across said plurality of probes or in positions being considered as critical in relation to the specific application so as to better detect a possible drift of the correct alignment of positioning.

Moreover, the electric test may provide the application of a current flow that crosses said pair of control probes; this electric test may be followed by means of a test circuit housed in a seal ring region of the electronic device.

An embodiment also relates to a semiconductor electronic device integrated with other devices on a substrate of a semiconductor wafer and comprising electric connection pads also intended for being contacts by a plurality of probes associated with an interface of a testing apparatus for quality checks based on electric tests, comprising at least one additional control pad specifically provided for being contacted by a control probe chosen among probes for executing a preventive electric test and deriving an estimate of alignment or correct positioning of the other probes.

The electronic device may comprise at least one pair of additional control pads arranged on opposite parts of said device.

More in particular, said additional control pads may be arranged on opposite angular regions of the electronic device.

Moreover, said additional control pads may be placed outside a seal ring delimiting, with respect to one another, said devices on said wafer.

BRIEF DESCRIPTION OF THE DRAWINGS

Characteristics and advantages of a process and of a device according to one or more embodiments will be apparent from the following description given by way of indicative and non-limiting example with reference to the figures of the annexed drawings, wherein:

FIG. 4 shows a schematic view from above of a semiconductor wafer and of an interface of a testing apparatus ATE as modified according to an embodiment;

FIG. 5 shows a perspective, schematic view of an electronic device integrated on semiconductor and incorporating additional control pads according to an embodiment;

DETAILED DESCRIPTION

Figure 1:
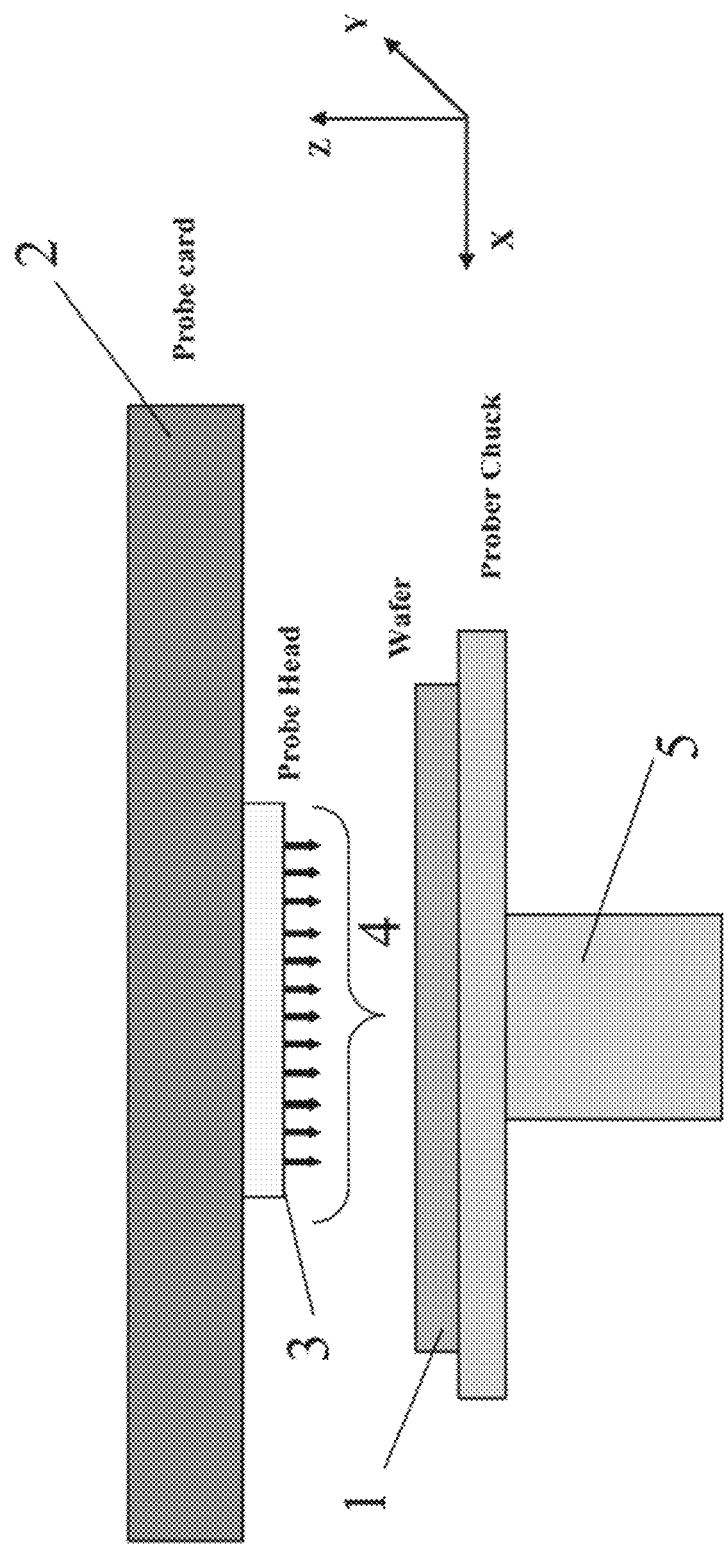
FIG. 1 shows a schematic view of a wafer whereon semiconductor electronic devices are realized subjected to final quality checks by means of an interface of a testing apparatus ATE.
Figure 2:
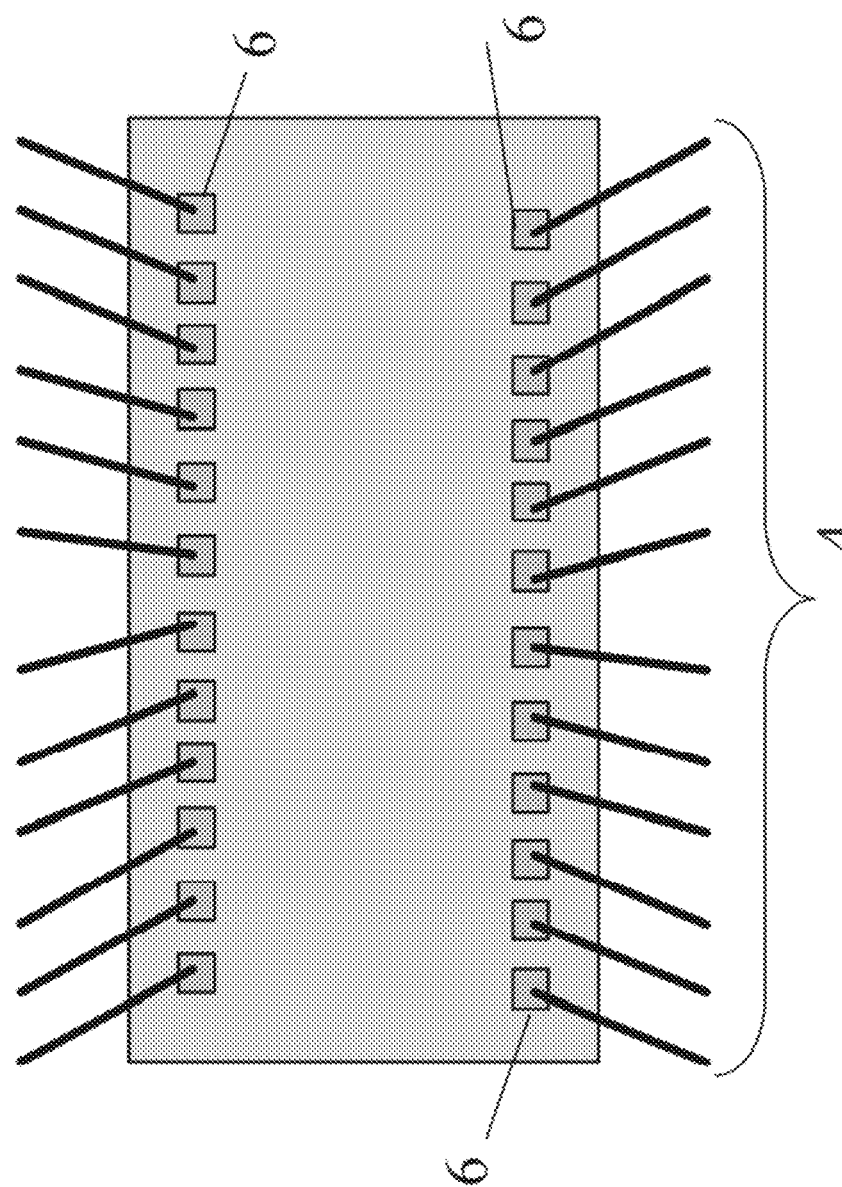
FIG. 2 shows a schematic view of an electronic device contacted by a plurality of probes of the interface of FIG. 1.
Figures 3A, 3B, 3C, 3D:
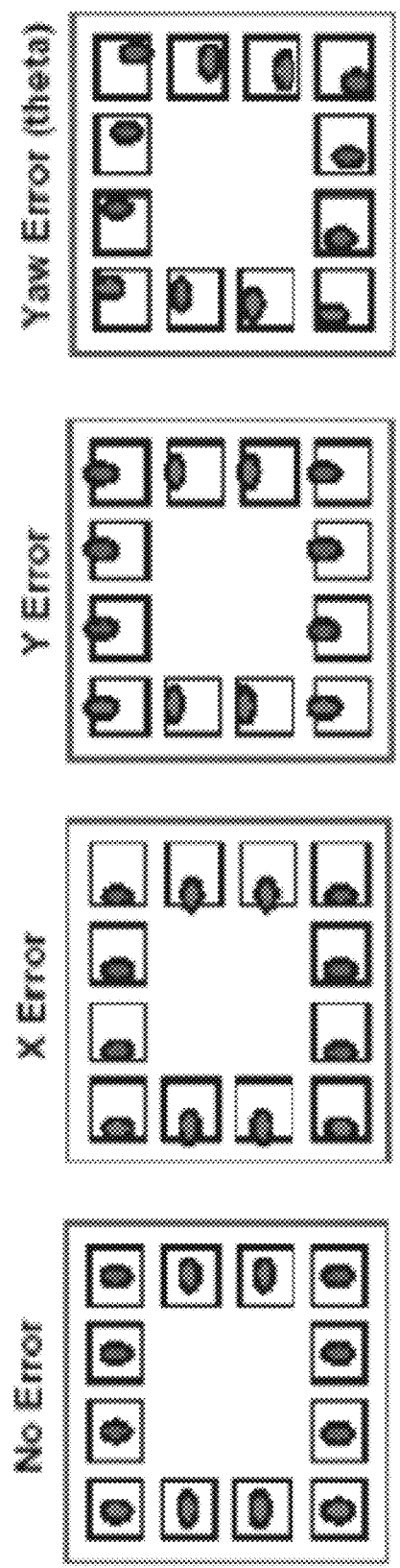
FIG. 3A is a schematic, enlarged view form above of tracks left by a correct contact of test probes on pads of an electronic device to be tested.
FIGS. 3B to 3D are respective schematic, enlarged views from above of tracks left by a wrong contact of test probes on pads of an electronic device to be tested.

With reference to the figures, and in particular to the examples of FIG. 4 and following ones, 10 globally and schematically indicates a semiconductor wafer whereon several electronic devices 11 are integrated according to an embodiment. These devices 11 are arranged in an orderly way on the wafer and delimited with respect to one another by demarcation lines 12 so called scribe lines.

Each electronic device 11 may be electrically contacted by means of a plurality of peripheral pads 13, in contact to which probes 4 of an interface 2 or probe card are guided mutually approaching and departing, the probe card being associated with a testing apparatus ATE, this latter being not shown since conventional.

As explained above, the presence of very hard pads 13 makes it difficult to identify a sign due to the contact of a probe 4 and, in consequence, it is difficult to value visually and in an easy way if the probing and testing process is occurring correctly.

In these circumstances it may be probable that breakages occur in the passivation protective layer that covers the electronic devices 11 to be tested; and devices with the broken passivation layer may have to be discarded.

According to an embodiment it has been provided that at least one control probe 24 chosen in the group or array 22 of probes 4 of the interface 15 is put into contact with an additional control pad 16 connected to a test circuit 17 associated with or internal to the corresponding device 11 through which a test procedure will test the correct contacting of the probe 24 on the pad 16. On the basis of the result of this check, information will be derived about the fact that the contacting or probing process does not have serious drifts, i.e. that the process is under control.

Considering a generic array 22 of probes 4 of a probe card 2 that are intended for contacting at least one device 11 of the wafer 10, it has been thought to use, for example, at least two control probes 24, 25 that may be placed at the ends of the array 22 of the probes 4 so as to be more sensitive and thus better detect a drift of the probing process.

In fact if the probing process has a drift, in general it will be more marked at the ends of the array 22 with respect to the other regions of the array 22 of probes 4.

The two control probes 24, 25 are suitably connected to two respective control pads 16, 18 belonging to at least one same device 11 on the wafer 10.

Moreover, for housing the test circuit 17 of the probing process, a portion of the wafer called a seal ring 20 (FIG. 6) may be, for example, used to which said two control pads 16, 18 will be connected. Through the seal ring 20 a current will be made flow during the test step. The flow of this current will supply the information that the probing process does not have a drift to be considered as dangerous.

For completeness of the description and for better understanding all the aspects of an embodiment, it is now suitable to illustrate more in detail the edge structure of the electronic devices 11 integrated on the wafer 10; this will be made with reference to FIGS. 6 and 7.

After an electric testing step of the various devices 11 present on the wafer 10, they are separated from each other through a conventional cutting operation of the wafer itself by means of the blades of a saw or a laser ray.

The electronic devices 11 being realized on the wafer 10 are normally already delimited with each other by a so called scribe line 12 that represents also the interstice whereon the cutting means that physically separate the devices during the cutting operation act. FIG. 7 shows an enlarged view of this scribe line 12.

Figure 6:
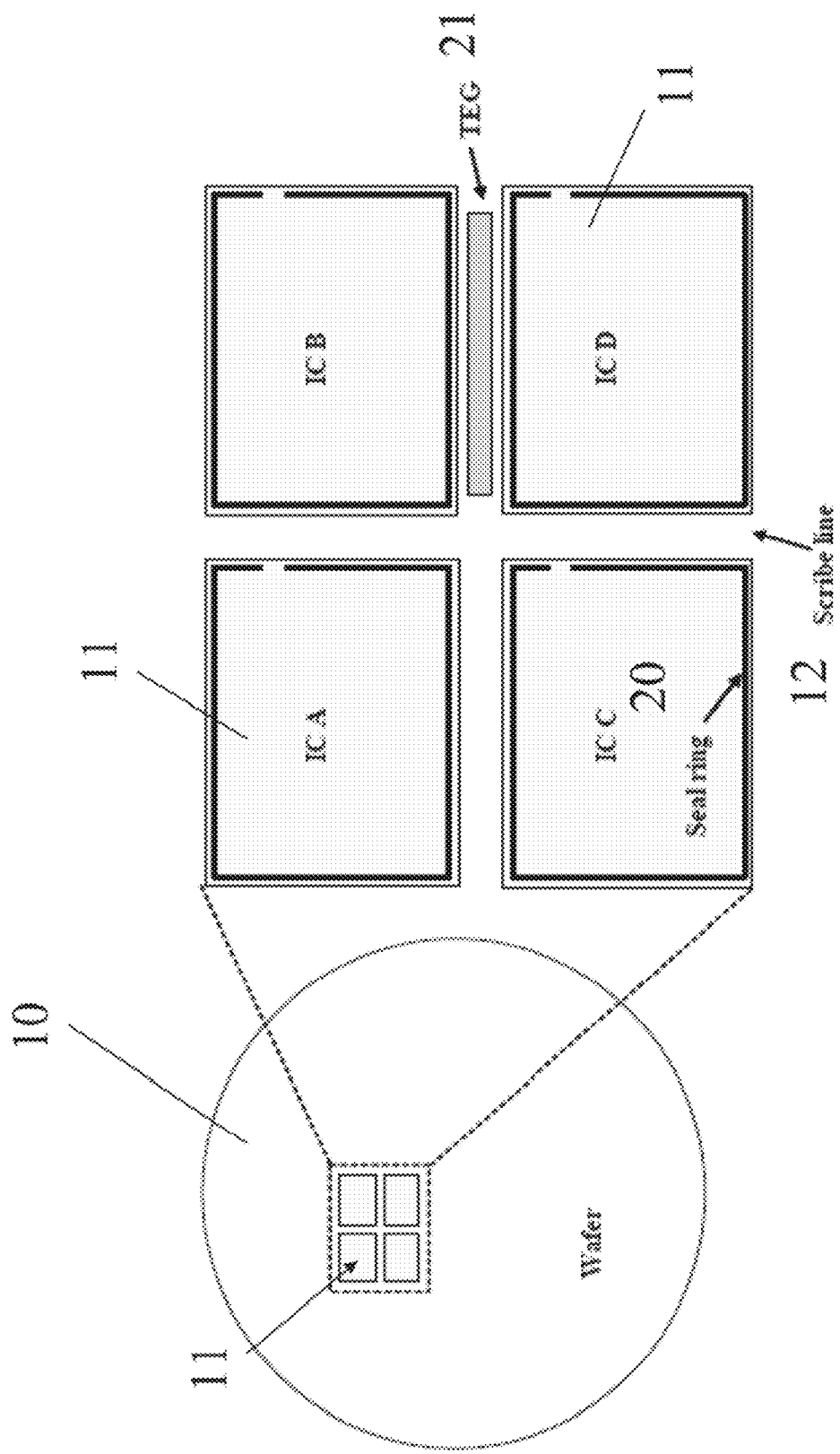
FIG. 6 shows a schematic, enlarged view from above of a group of electronic devices adjacent to each other on a semiconductor wafer according to an embodiment.
Figure 7:
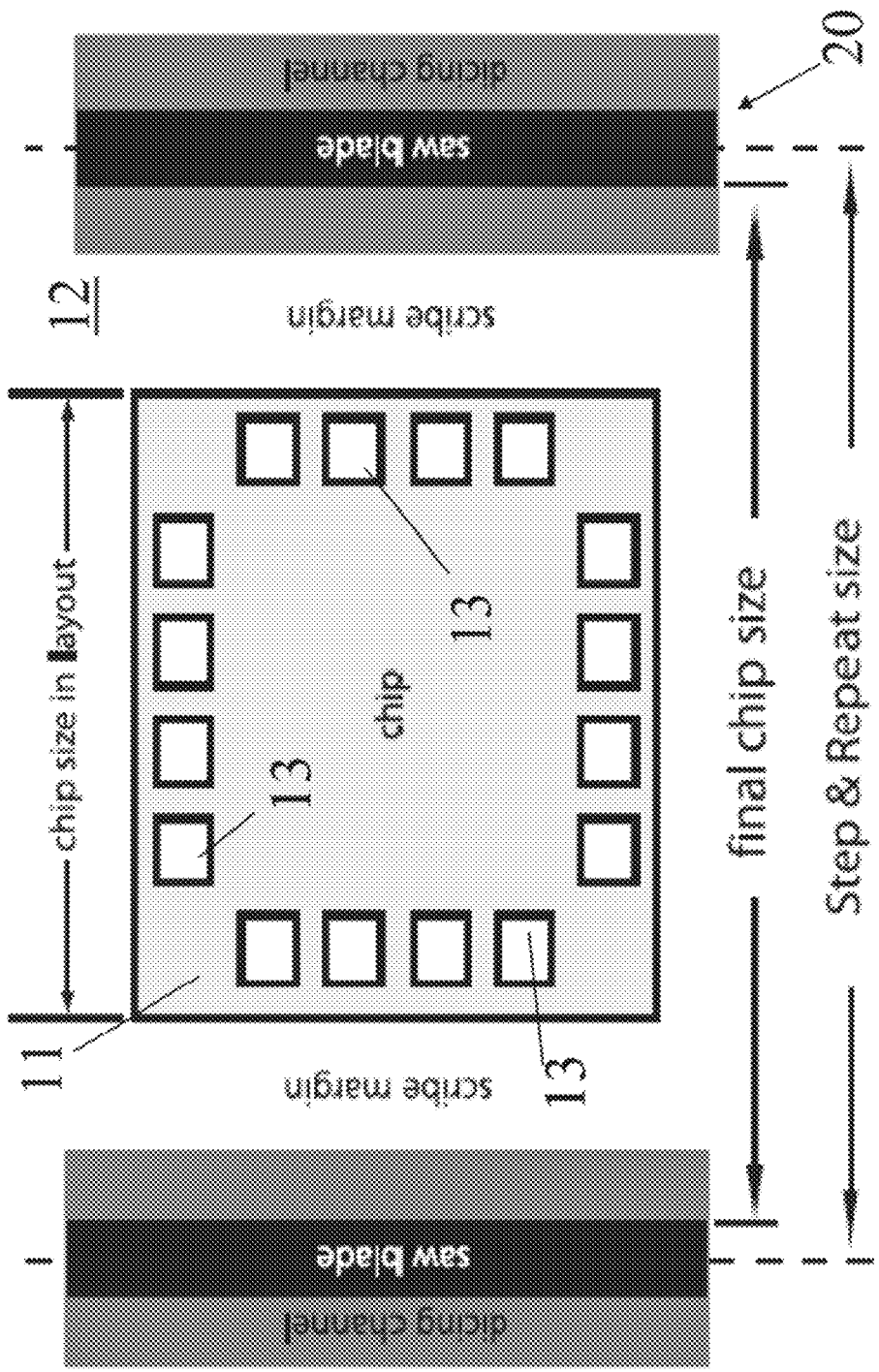
FIG. 7 shows a schematic, enlarged view from above of an electronic device and of the near structures according to an embodiment.

The scribe lines 12 are often exploited also for introducing elemental structures 21 or TEG (Test Element Group) intended for the testing of some process parameters, that are measured in general prior to the electric test on wafer, as shown in FIG. 6.

To protect the electronic devices 11 from the mechanical actions exercised by the blade during the cutting, each device 11 is peripherally surrounded by a so called seal ring 20 that has the aim of sealing the device 11 itself and strengthening it mechanically for ensuring the reliability also after the cutting.

The seal ring 20 is put in general between the area where the pads 13 are placed, or pad ring of the device 11, and the scribe line 12 that surrounds the device 11 itself.

The seal ring 20 is formed with more metallic layers and vias and also serves for blocking ions and contaminative substances too that can jeopardize the good operation of the device 11.

Several implementations of seal ring are however known, where for example dielectric layers and metallic layers are alternated.

Sometime for avoiding problems of interferences in radiofrequency, open loop seal rings are realized instead of closed loop ones so as to avoid that the seal ring behaves like a coil.

The angles of the seal ring 20 may be the most critical regions and they are usually reinforced, for example, by using metals of greater size and possibly rounded off/smoothed.

Situations are also known in which at the angles of the seal ring 20 there are suitable patterns of structures that avoid the damaging of the angles of the seal ring itself.

An embodiment also provides that the additional pads 16, 18 may be suitably positioned outside the seal ring 20.

More in particular, these additional pads 16, 18 may be realized in correspondence with opposite angular regions of the electronic device 11 outside the seal ring 20, which in correspondence with these opposite angular regions is deviated to form substantially a part of a polygonal path.

With this structure it may be possible to execute a preventive test to check the correct alignment of the probes before starting with the electric test for checking the correct operation and the quality on a given electronic device contacted by the array of probes 4.

For example, by first exploiting the additional pads 16, 18 with the corresponding control probes 24, 25 it may be possible to make a current circulate through these two control probes 24, 25. If this current does not circulate correctly, this means that there is a drift of the probing process due to for example to probe-pad alignment problems, or that there are problems of electric continuity or other.

To make this initial check more sensitive, the above two control probes 24, 25 may be subjected to a stress being identical or greater than the stress to which the generic probe 4, which is considered the more critical than the array 22 of probes, is subjected.

For example if there are probes 4 crossed by high currents during the test of at least one device, a current will be made to circulate being identical or greater in the control probes 24, 25 of the probing process with respect to the most critical probe 4 during the test of that given device; in this way the drift of the probing process may be detected in advance.

The two additional pads 16, 18 intended for the check of the alignment may also have smaller size with respect to the other pads 13 of the device, so as to make the check even more sensitive.

Moreover, if these two additional pads 16, 18 are placed outside the seal ring 20 there may also be the advantage of not increasing the area of the device.

It is to be noted that the presence of the additional pads 16, 18 on opposite angles of the device 11 may confers a greater strength of the seal ring 20 that passes nearby, indirectly protecting this angle of the device during the cutting of the wafer.

All these considerations may be naturally extended to the case of simultaneous testing of more devices in parallel.

To facilitate the testing in parallel it has been thought to add suitable interconnection structures 23 (FIG. 9) that connect to each other at least two additional pads 16, 18 placed in two bordering angular regions near two distinct seal rings 20.

Figure 8:
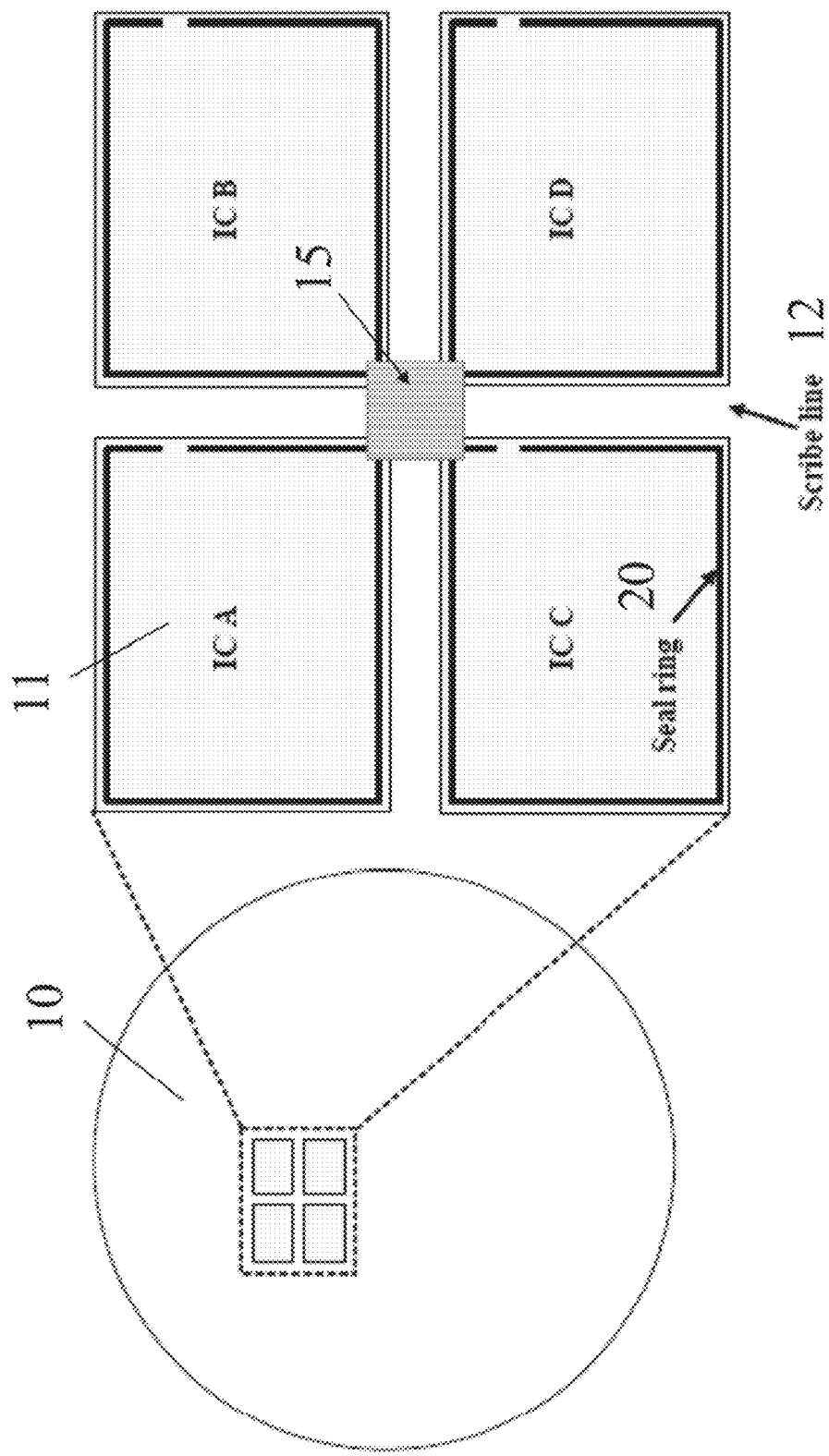
FIGS. 8 and 9 are further schematic, enlarged views from above of the group of devices of FIG. 6 according to an embodiment.
Figure 9:
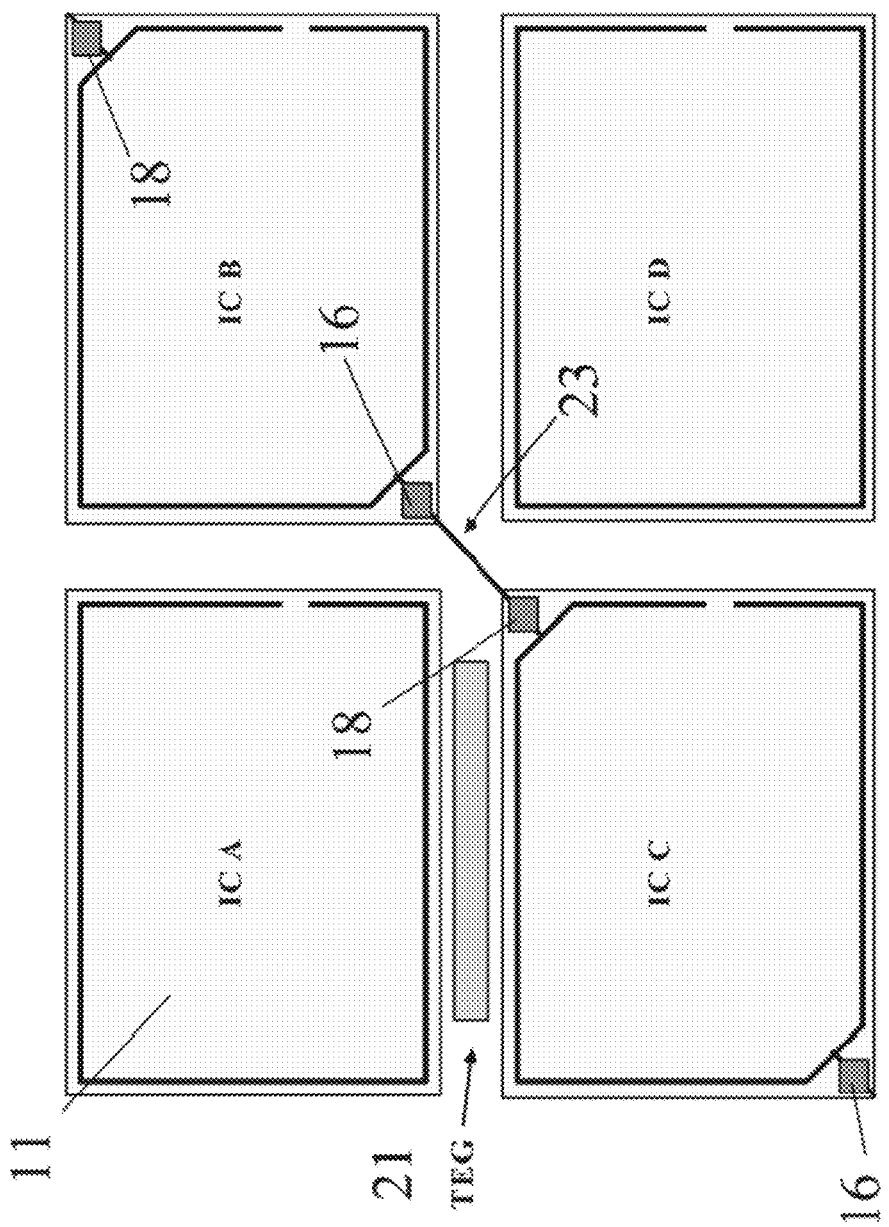

As shown in FIGS. 8 and 9 these interconnection structures 23 may be extended only to the angular regions 15 of adjacent devices and, being near the seal ring 20, they do not interfere with the TEG 21 placed in the scribe lines 12 of the wafer 10.

Figure 10:
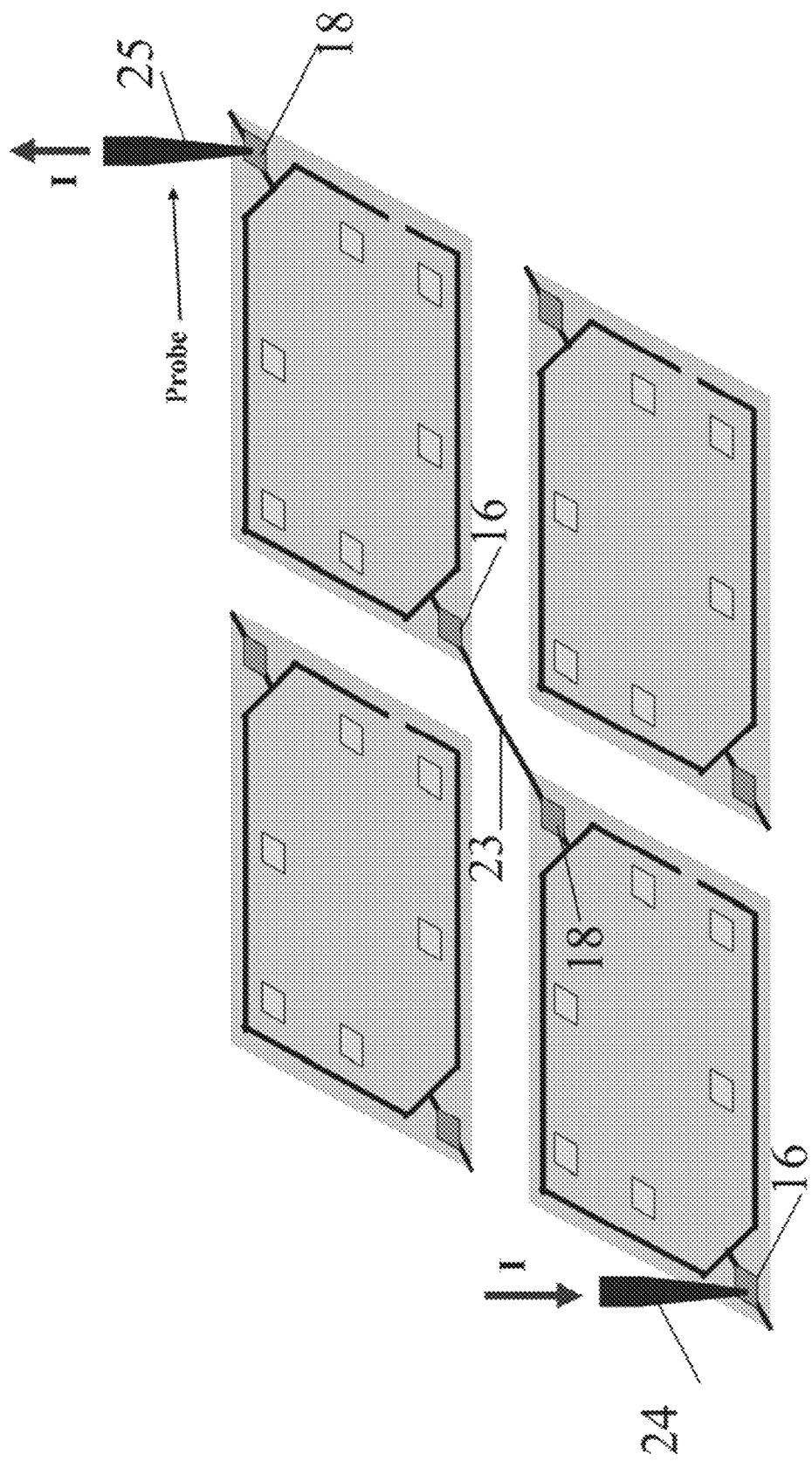
FIG. 10 shows a perspective, schematic view of the group of electronic devices of FIG. 9 incorporating two additional control pads according to an embodiment.

With the above described measure, a test current may be made to circulate between at least two devices 11 placed on the wafer 10 although applying the sole two probes 24, 25, as shown in FIG. 10.

The interconnection structure 23 may be realized by means of at least one metallization track that will pass through the scribe line 12 or above the same.

The use of at least two metallization levels connected by at least one vias, for realizing the interconnection 23, may allow reducing the stress that the seal ring 20 will sustain when this interconnection 23 is cut by cutting means that physically separate the devices 11 during the cutting operation.

Figures 11A, 11B:
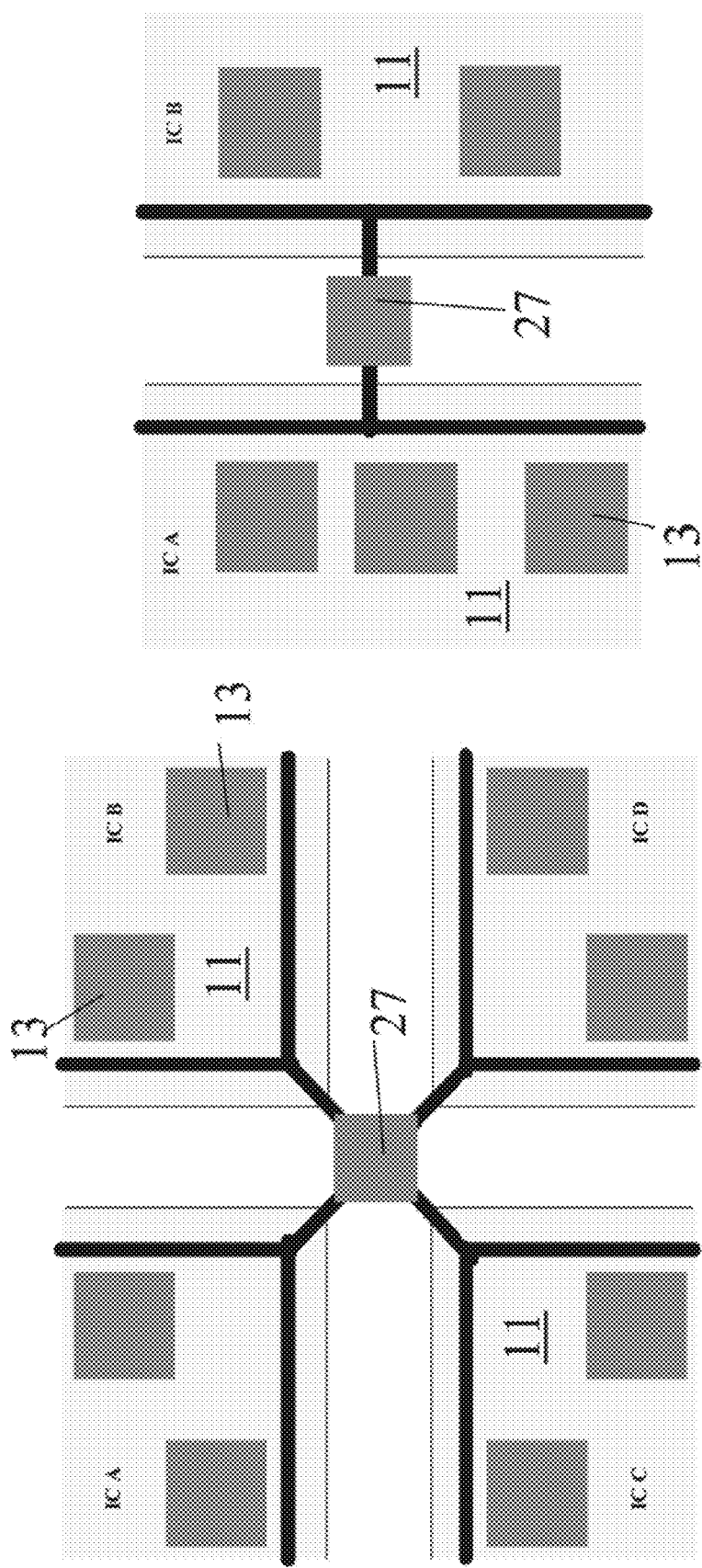
FIGS. 11A, 11B and 12 show respective schematic views of enlarged details of some electronic devices integrated on semiconductor wafer and structured according to an embodiment.

Suitably, a control pad 27 may be provided on the interconnection structure 23 being substantially positioned between the bordering angular regions of two devices 11, as shown in FIG. 11A.

In general these structures may be positioned also along the scribe line 12 as shown in FIG. 11B according to the application.

Figure 12:
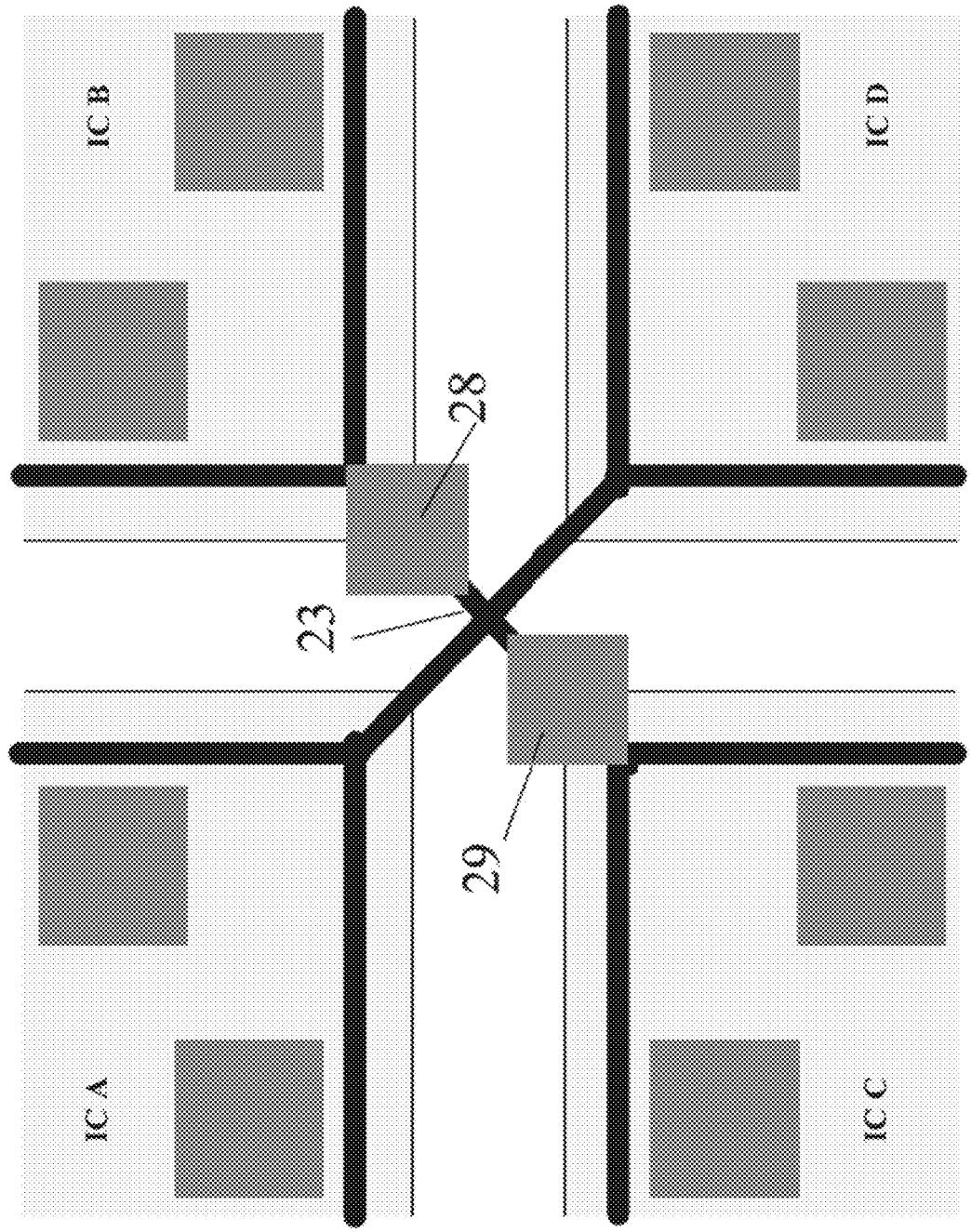

As shown in FIG. 12, also plural control pads may be provided, for example a pair of pads 28, 29, arranged on the interconnection structure 23 between two bordering angular regions, so as to make the electric check of the probing process more sensitive.

Figure 13:
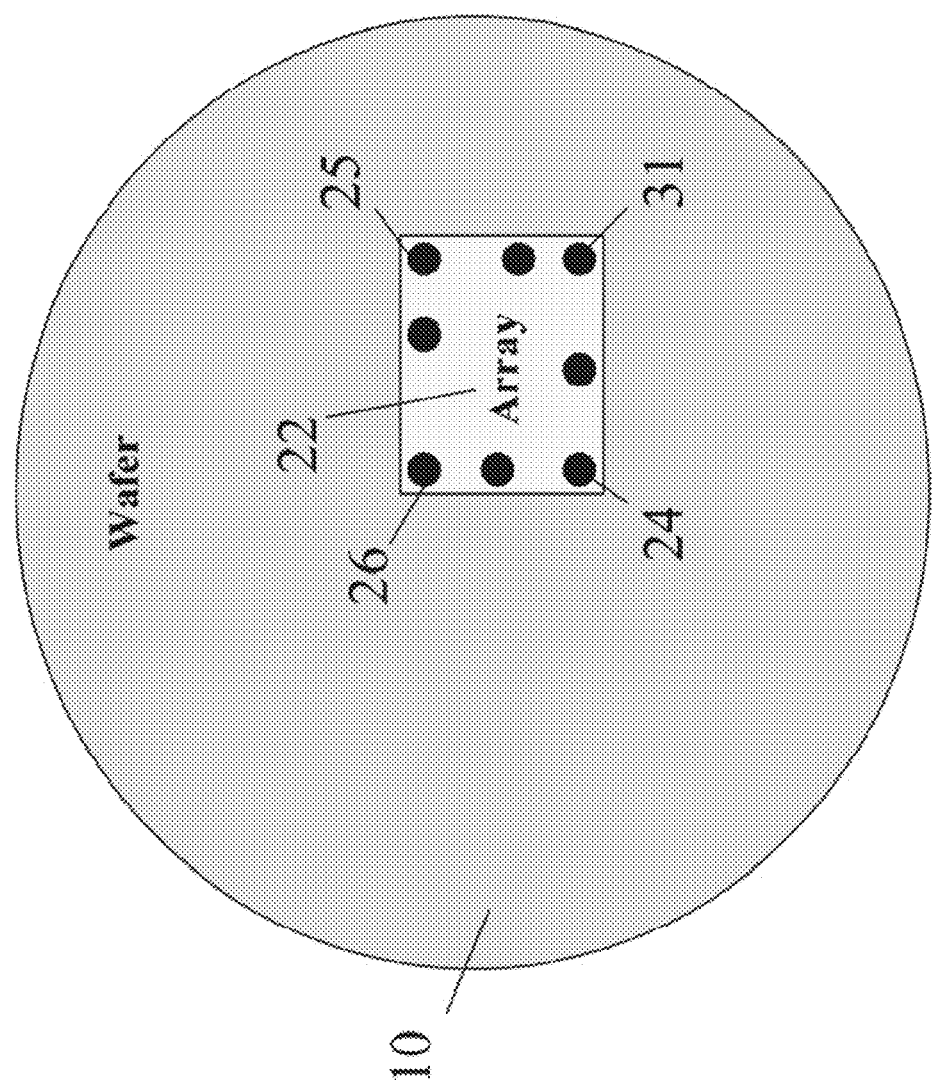
FIG. 13 shows a schematic view from above of a semiconductor wafer and of an interface of a testing apparatus ATE modified according to a further embodiment.

To facilitate the testing operations provided by the process of an embodiment it may be possible to equip the probe card 2 connected to the testing apparatus ATE with control probes placed in any angle of the array of probes 4; for example, FIG. 13 shows a rectangular array 22 of probes with four control probes 24, 25, 26 and 31 arranged in the corners.

Figure 14:
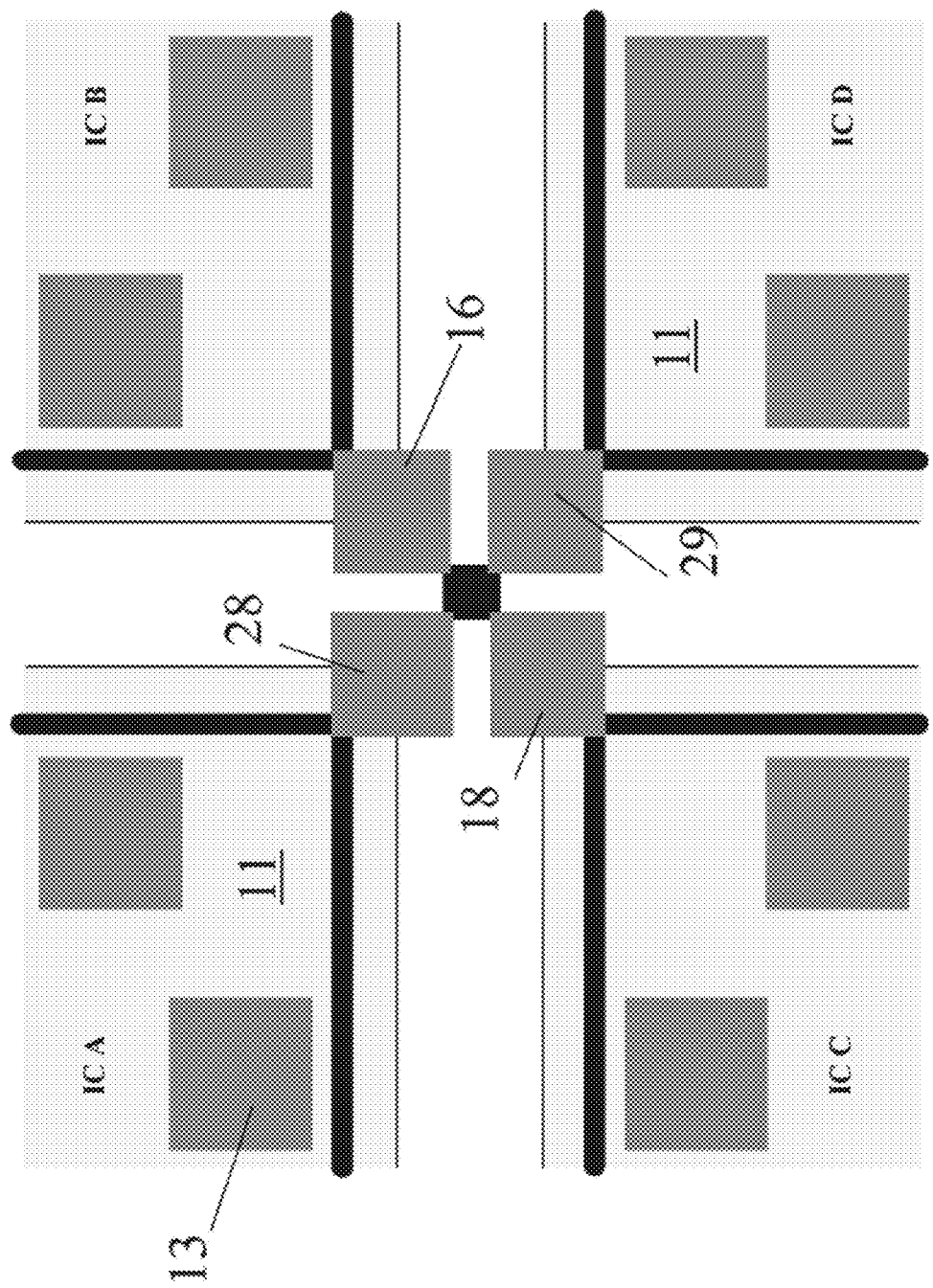
FIGS. 14 to 21 are respective schematic, enlarged views of angular regions of near electronic devices on the wafer of FIG. 6 and relative to different embodiments.

It may also be possible to have a control pad 16, 18, 28, 29 for each corner of the device, and each corner may be electrically connected to the corners close to it, as shown in FIG. 14.

A plurality of control pads may be present and suitably positioned so as to have control probes not only in the angles/corners of the array 22 but for example along its perimeter so as, for example, to have more types of alarm.

Possibly, the control probes may also be far from the array of probes 22 due to constructive problems of the probe card 2, or for increasing the check sensitivity.

Figure 15:
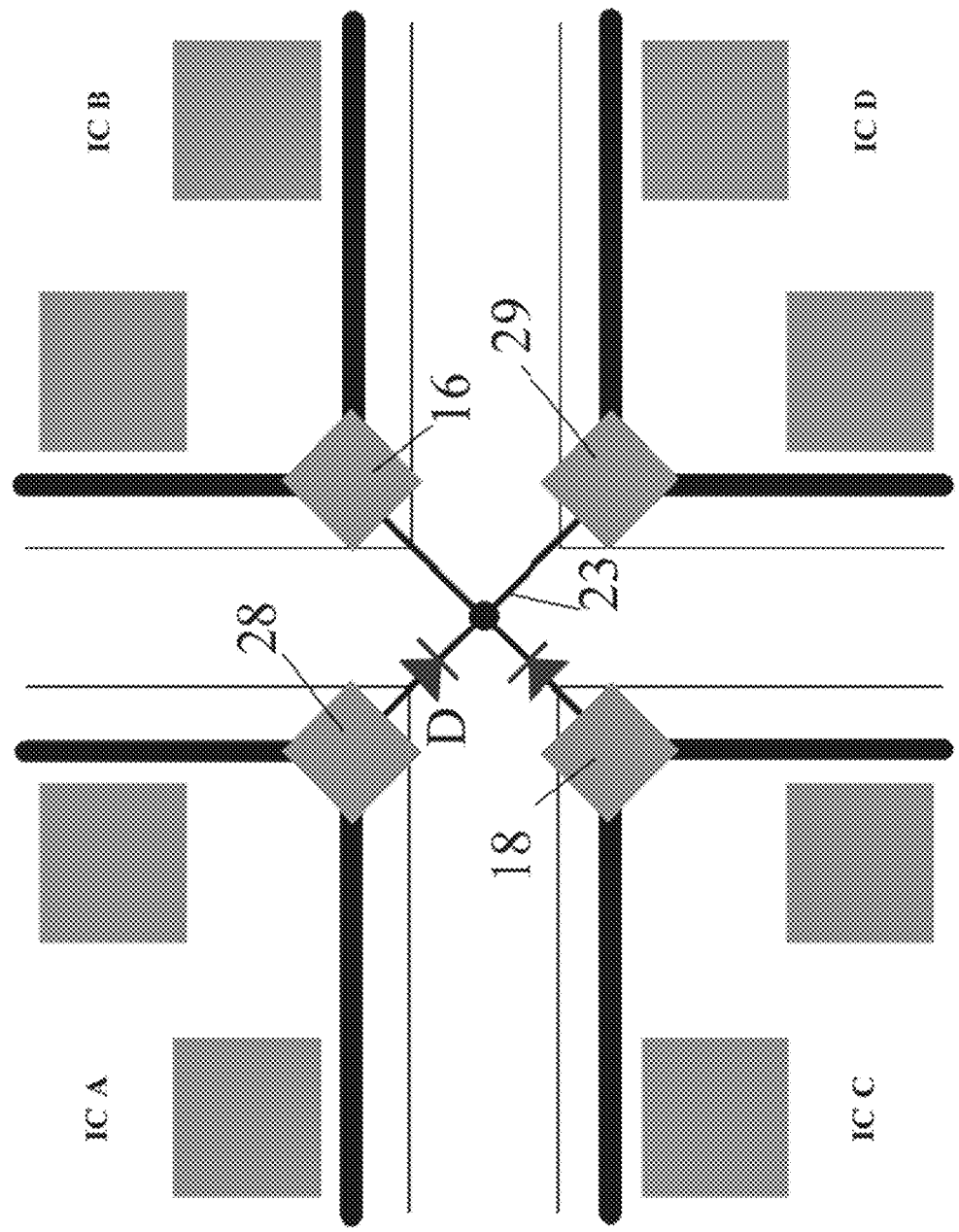

In case test circuits 17 devoid of closed coils are to be realized, for example for avoiding radiofrequency problems, the structure may be complicated a little by integrating suitable circuits. For example, as shown in FIG. 15, it is possible to integrate at least one diode D on the interconnection structure 23 between control pads 16, 18 or 28, 29. This allows making at least one path through which the current flows unidirectional, as shown in FIG. 15.

Figure 16:
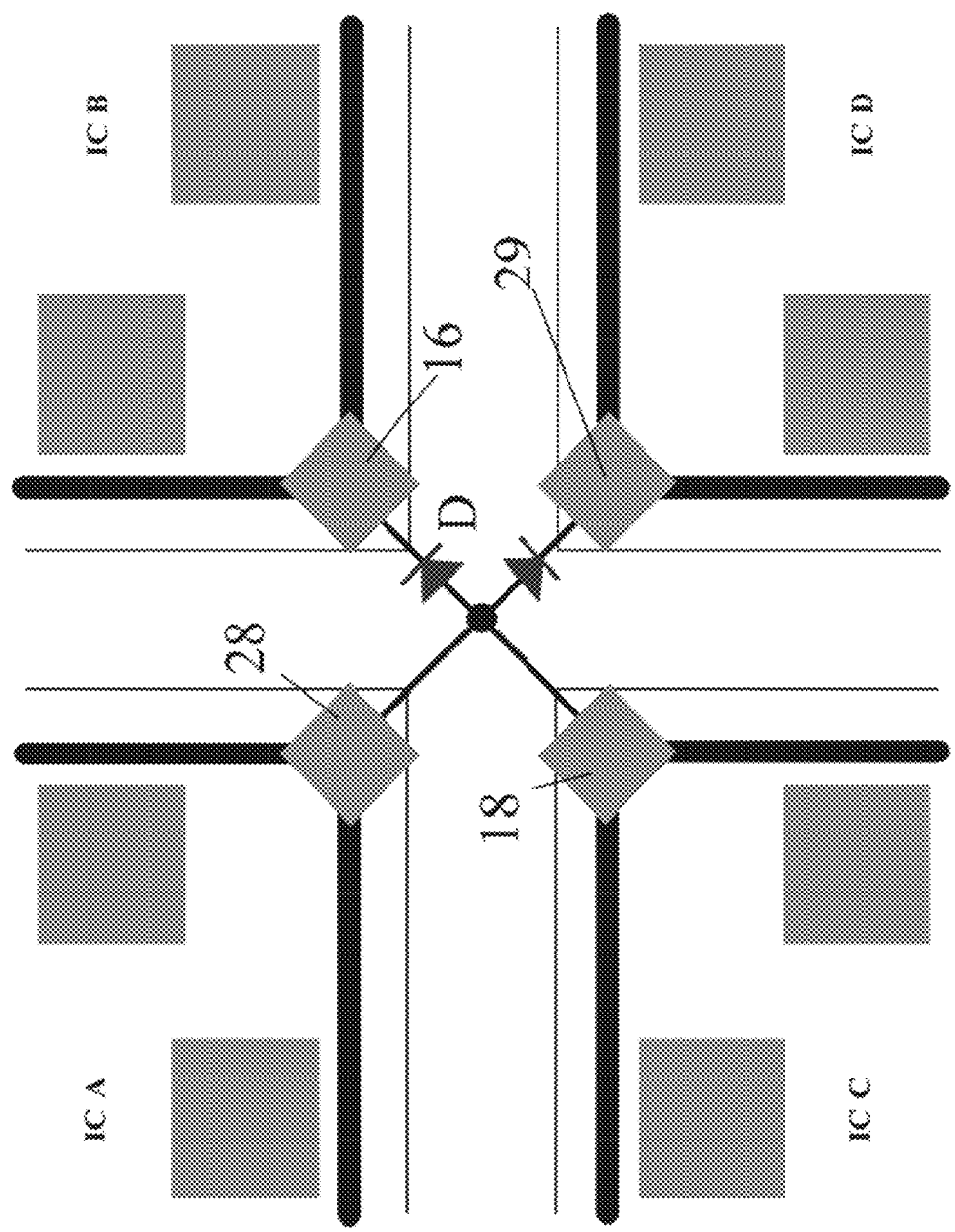

For example as shown in FIG. 15 or 16 by connecting the four angular regions of four adjacent devices two diodes D will be positioned, and by rigidly repeating this structure, also according to the design of the seal ring that is an open loop one, the creation of coils will be avoided, however allowing that the current can have at least one possible path between the at least two control probes 24, 25 or 26, 31.

Figure 17:
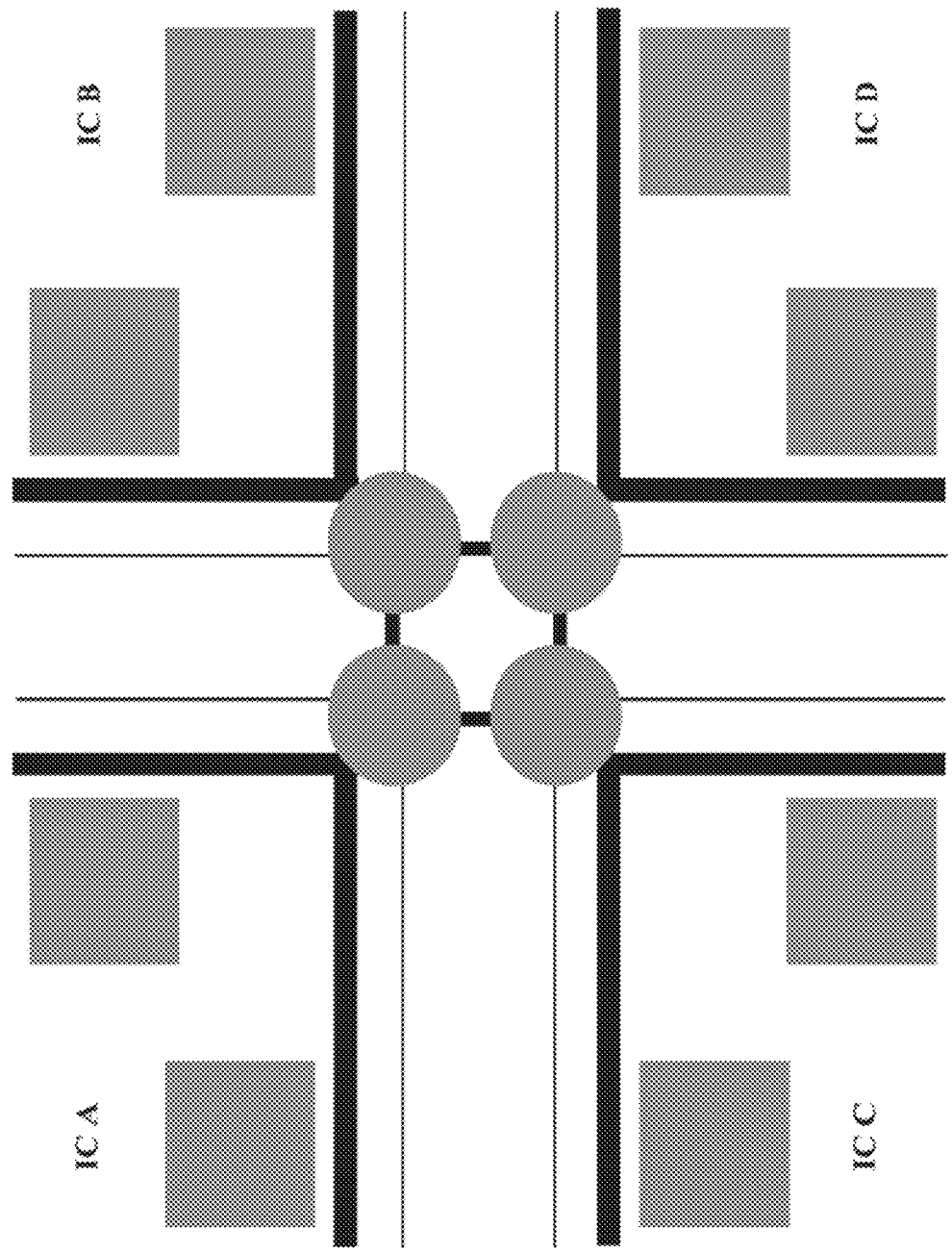

The control pads may have a circular form so that the check does not depend on the different orientation of the control probes, as shown in FIG. 17.

Now, with reference to FIGS. 18 to 21 embodiments are shown in which the control pads 35 are realized inside the single electronic device 11, they may thus increase the area of the device itself with a consequent slight increase of the costs.

Figure 18:
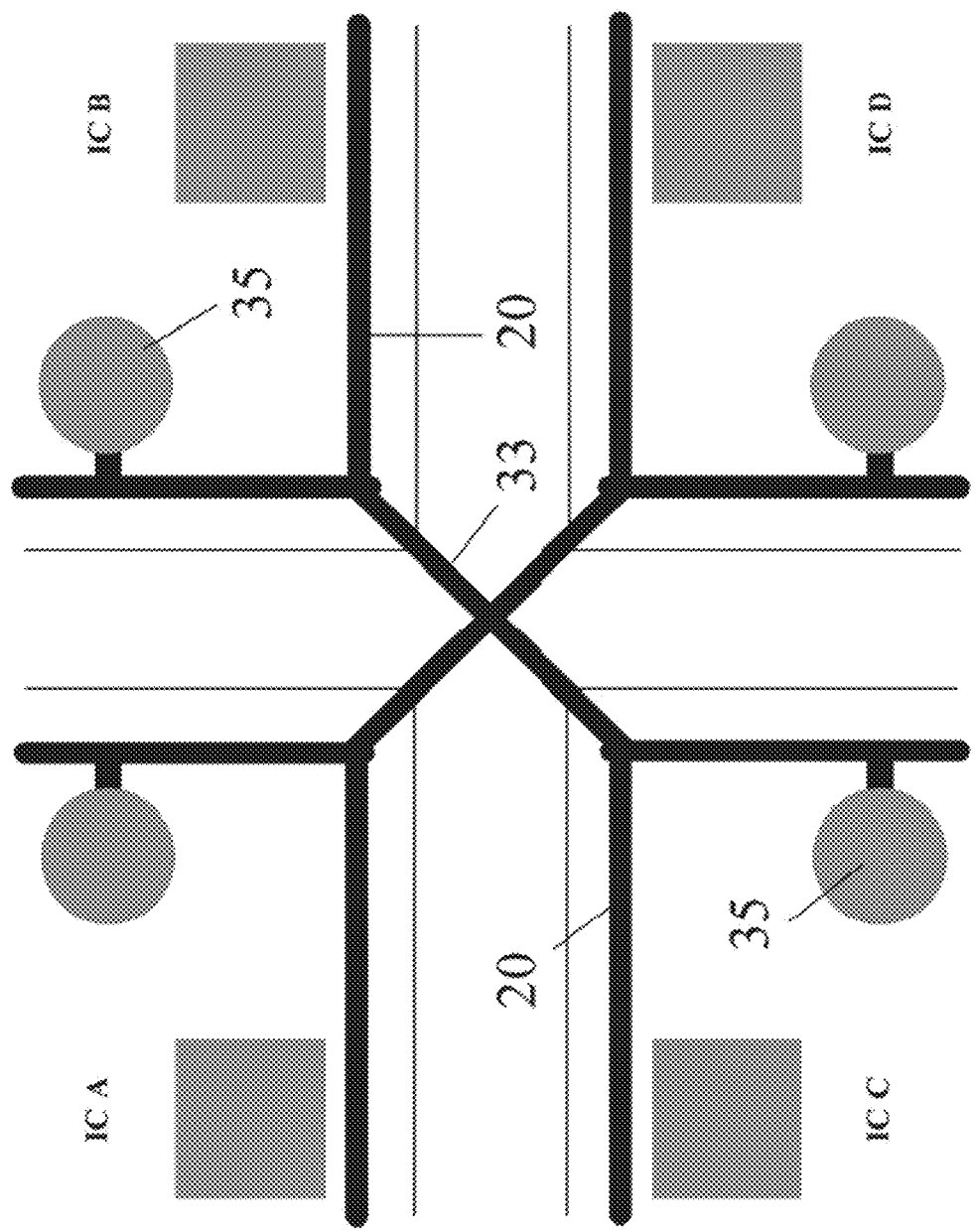

In this case it may be suitable to connect to each other at least two adjacent seal rings 20 for allowing the testing in parallel of at least two devices 11, as shown in FIG. 18 with the interconnection lines 33.

Figure 19:
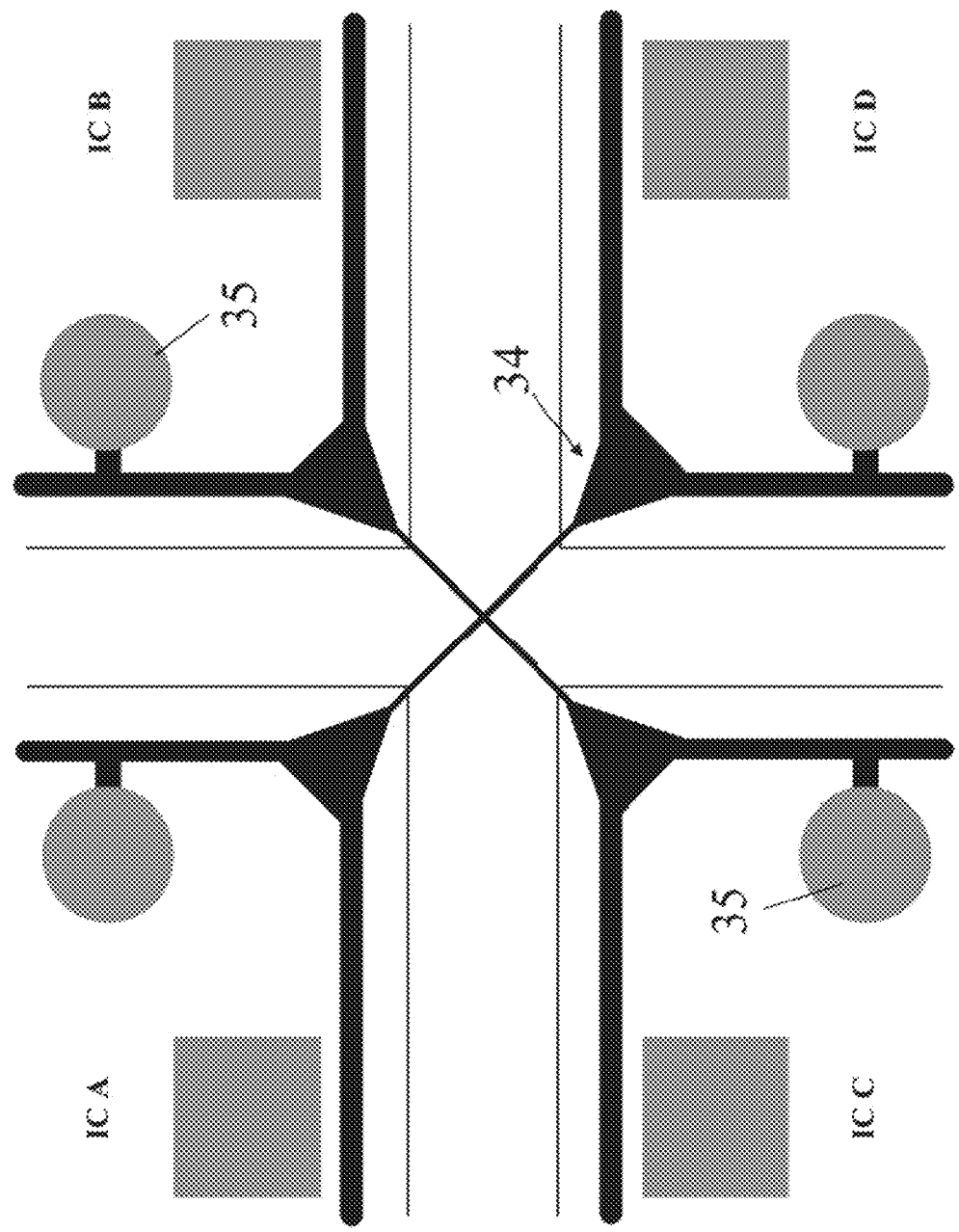

If this connection occurs between two angular/corner regions of the device, the generic angle 34 of the seal ring 20 may be advantageously strengthened so that it is less likely to be damaged by the cutting of the wafer, as shown in FIG. 19.

It may thus be advantageous to reduce, as much as possible, the sizes of the connection metals so as to facilitate the cutting process of the wafer by using, for example, at least two metal levels and at least one via as discussed for the connections 23 of FIGS. 9 and 10, but however this has a general validity considering the connections between the at least two seal rings 20 of at least two different devices 11.

However, several forms of connections are possible between at least two adjacent devices 11 incorporating in their interior the control pads 35.

Figure 21:
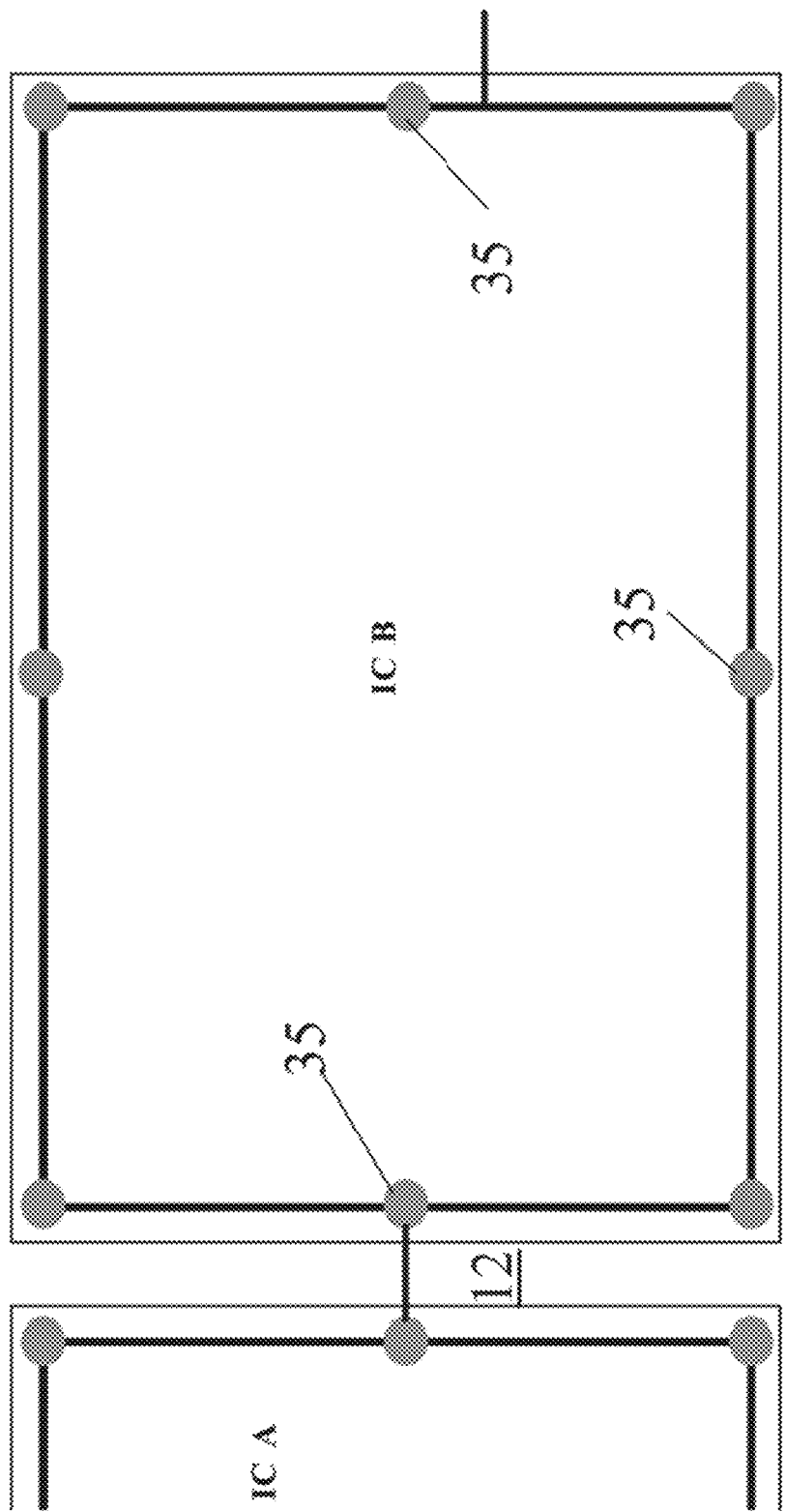

Nothing forbids providing several control pads 35 for each device 11 and not necessarily in the angles of the seal ring 20, according to the application, as shown in FIG. 21.

By increasing the number of control pads 35 the arising of false alarms may be reduced, and also different levels of severity of the alarms may be attained.

Figure 20:
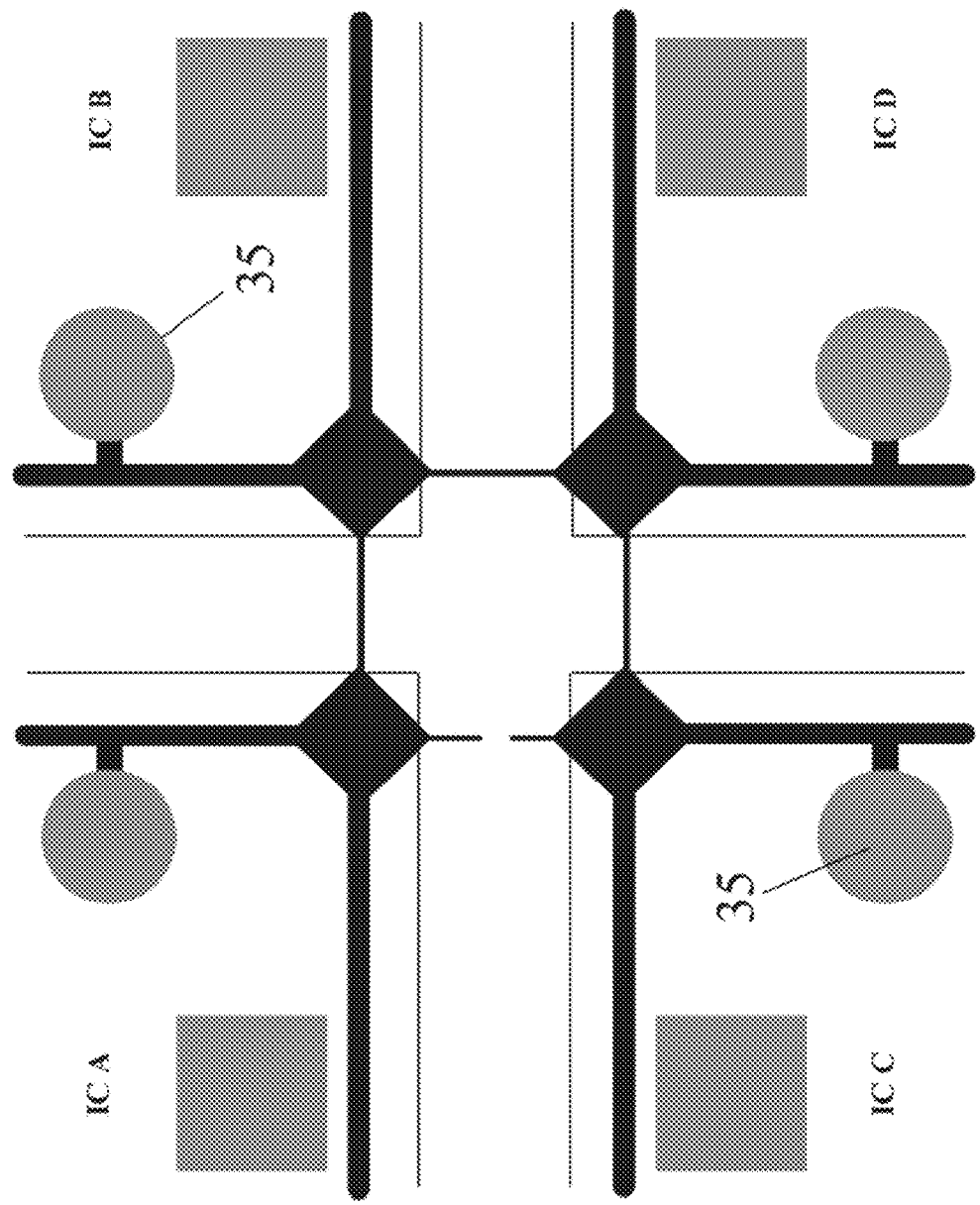

The various seal rings may be connected to each other in various ways, for example as shown in FIG. 20 and not necessarily in the angles of the same seal ring, as shown in FIG. 21.

In the example of FIG. 20 if one of the connections between two seal rings 20 is faulty, for example it has a non desired interruption, the other connections between the other seal rings 20 will however allow the electric check of the position of the probes.

By incorporating these control pads directly in the seal ring 20 it may be avoided that they may be internal to the device and it is avoided that they may hinder the circuits 21 of the TEG, if these control pads are housed for example inside the scribe line 12, as shown in FIG. 21.

This depends on the circuits 21 of the TEG and on which probes of the probe card they tend to drift earlier during the probing and testing process.

The generic control pad may be thus housed or even be part of the seal ring 20. Also the mirrored structure or suitable modifications thereof, for example further to rotations may be valid.

Figure 22:
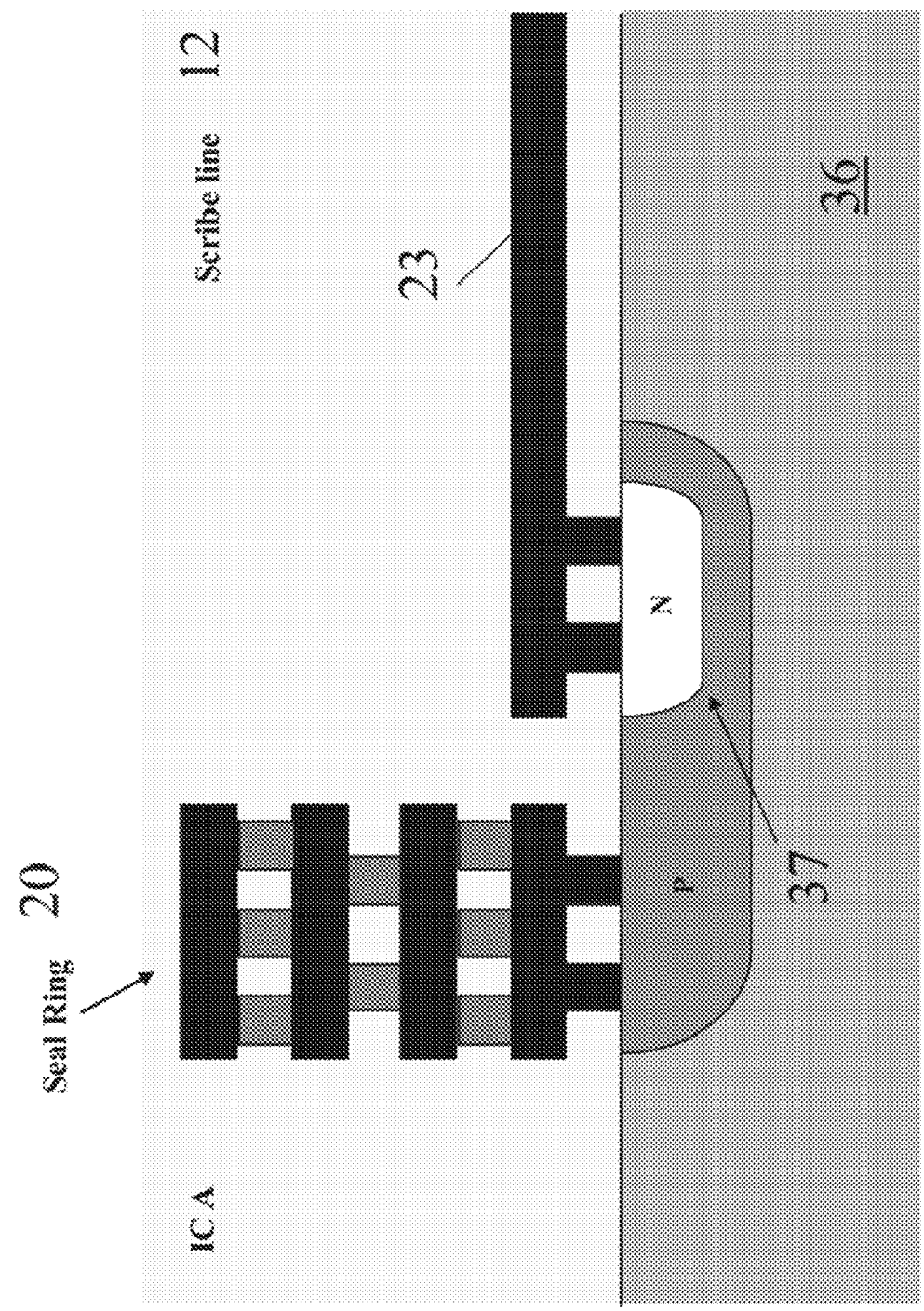
FIGS. 22 to 25 are respective schematic, vertical section views of details of an electronic device according to an embodiment.

A diode may be realized, for example, through a junction PN 37 in the substrate 36 of the wafer 10 between the seal ring 20 and the metal path of the interconnection structure 23, as shown in FIG. 22.

Figure 23:
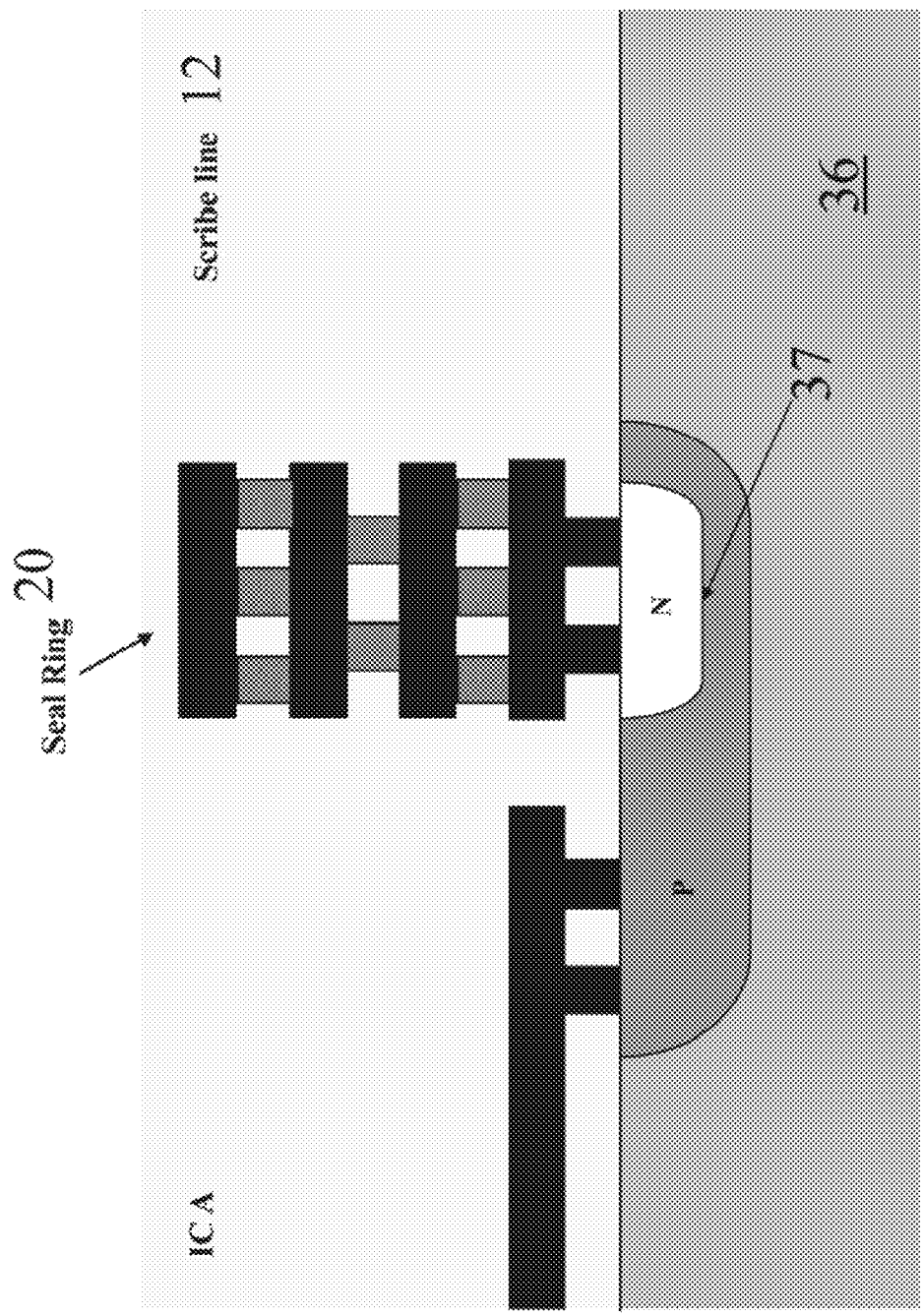

In FIG. 22 and in the following ones, the place of the P doped material and of the N doped material may be exchanged, according to the circuit that is to be implemented, according to the dopant of the substrate 36 and according to specific design needs. With respect to the scribe line 12, also the placement of the seal ring 20 with the metal path may be changed, as shown in FIG. 23.

Figure 24:
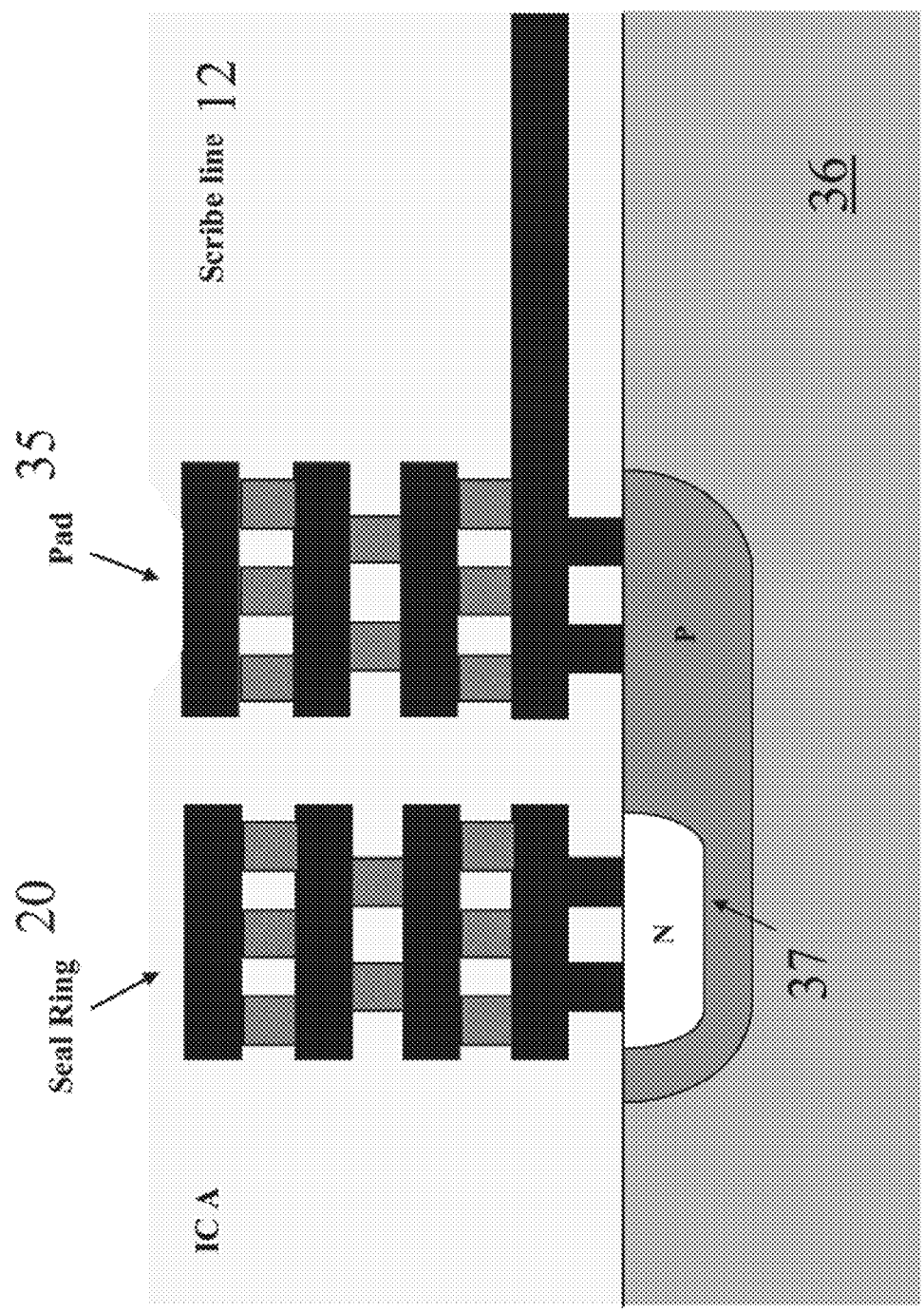

Also the control pad outside the seal ring 20 may be added, as schematically shown in FIG. 24.

Figure 25:
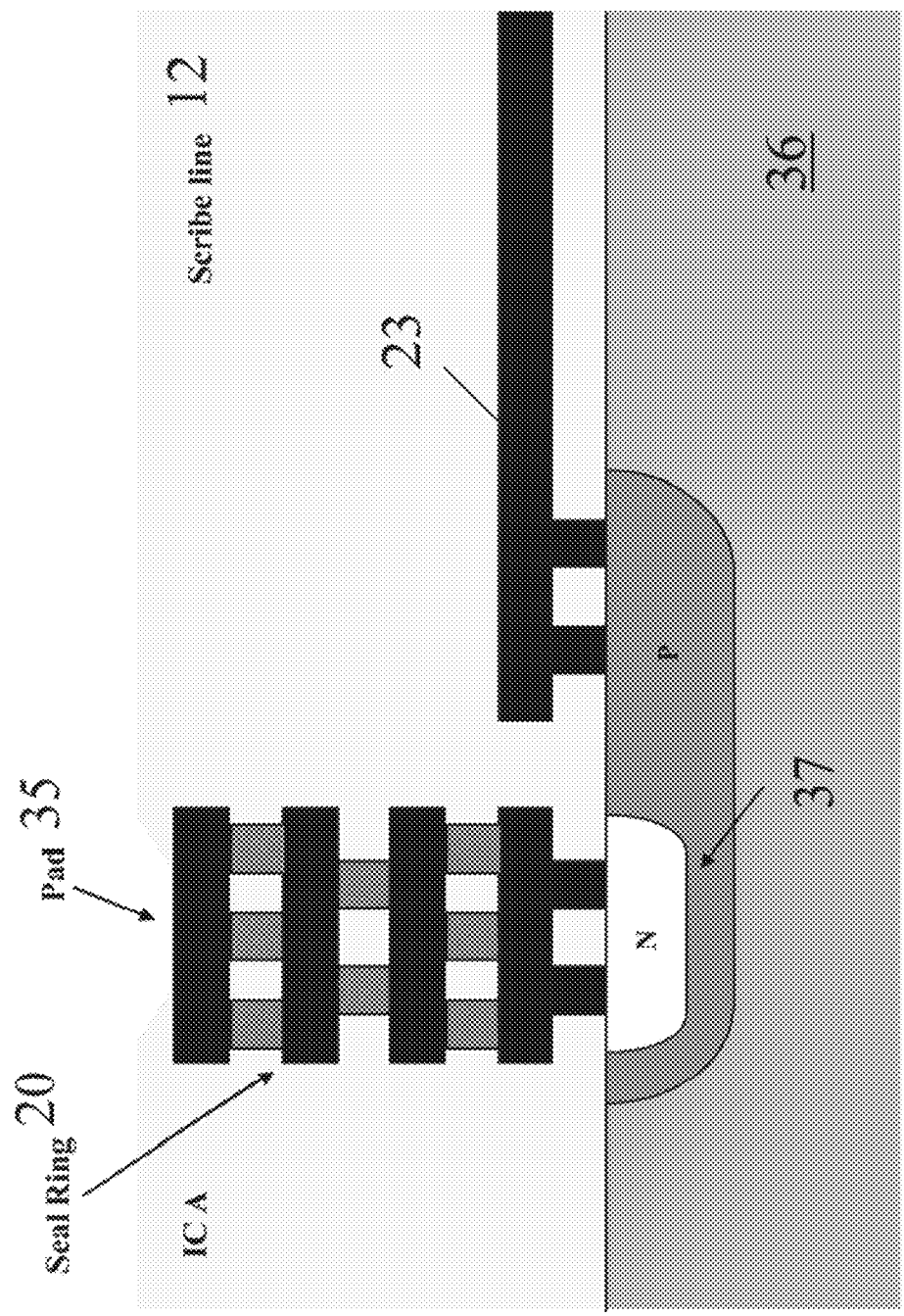

The control pad 35 may be formed on the same seal ring 20, possibly locally increasing its size, as shown in FIG. 25.

Figure 26:
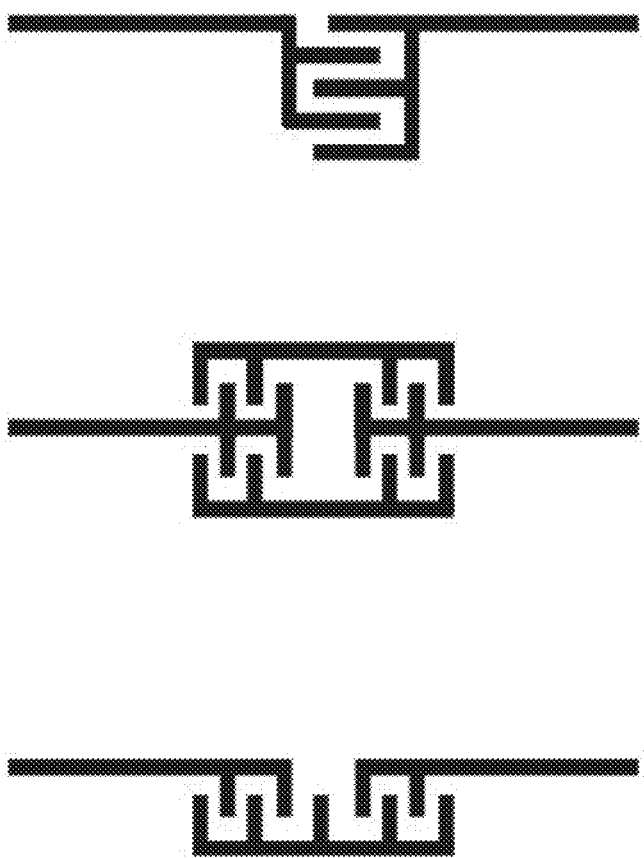
FIGS. 26 and 27 are respective schematic views of alternative embodiments of a device.

Moreover, where the seal ring 20 is interrupted for avoiding the creation of coils, reinforcement mechanical structures may be placed, as shown in FIG. 26.

For example interdigited structures may be realized, that may be used also for their capacitive behavior, and thus for the check of the probing process a radiofrequency signal may be made to circulate in the seal ring 20, this may be advantageous if for example the most critical probe of the array 22 is a probe for radiofrequency signals.

Alternatively, in the seal ring 20 suitable structures may be formed for signals RF.

Thanks to the at least two control pads 16, 18 connected to the seal ring 20, the seal ring may be possibly divided into more parts for transporting signals and supplying to circuits connected to the seal ring itself.

Figure 27:
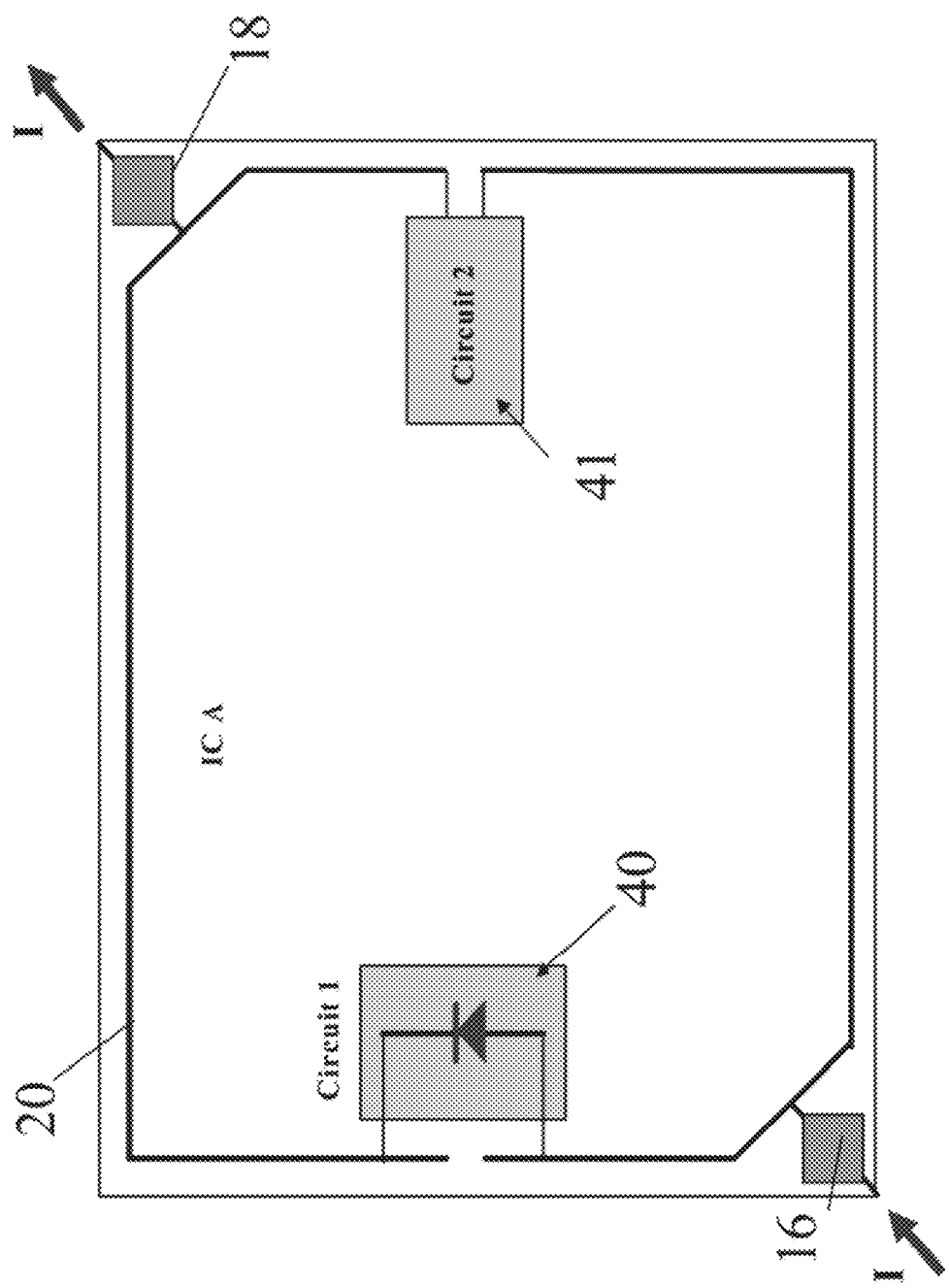

In consequence, in general circuits may be connected to the seal ring, for example those shown with 40 and 41 in FIG. 27. The circuit 40 may be, for example, formed by at least one diode that may be used for the probing process check and through which the current necessary for the needed tests flows.

The presence of the diode may allow for identification of the problems of contact resistance between the probe and the pad thanks to a suitable test that measures some characteristics of the diode from which information on the contact resistance may be derived.

The circuit 41 may be used for different aims and supplied through a current that comes from the device 11 or through the control pads 16, 18 making a current circulate being opposite to the direction of the diode of the circuit 40 that will thus be akin to an open circuit.

This circuit 41 may be advantageously used, for example, for containing in a memory useful production data such as the number of lot, the number of the wafer and the coordinates XY of the device on the wafer.

In consequence these control pads 16, 18 may remain on the device 11 and being not removed by the cutting of the wafer and being used again afterwards, for example during the analysis of the failure of the device indicated by a client.

The circuit 41 may also be an interface, for example serial, towards the BIST circuits of the device, and thus these control pads 16, 18 may be used also for the test of the device itself.

Moreover, the elemental structures, the circuits and the methodology described may be possibly and advantageously adapted also for incorporating some structures of the TEGs for parametric measures of the technological process.

For example, the system in one of its implementations may have a long metallic path between two control pads being enough far from each other, and this may for example allow to obtain a measure of the resistance of this metallic path.

It is possible to provide also an index of contact problems between the probe and the pad.

An embodiment makes it possible an electric check of the probing process of the wafer.

Moreover an embodiment of a structure allows for strengthening the device during the cutting step of the wafer 10.

Moreover the seal ring 20 may be used also as a circuit element of the device itself.

Moreover it may be possible that the current for the check of the position of the probes instead of flowing between two pads 16 and 18, flows for example between the substrate 36 and the pad 16, and this current will be injected, for example, through the chuck 5 of the prober in electric contact with the substrate 36. Also a vice versa case may be valid.

The seal ring 20 or at least part of the same may have the possibility to be electrically insulated or not by the substrate 36 of the wafer 10 according to the specific circuit that is to be realized, according to the various design ties of the specific device 11 considered.

Naturally for meeting incidental and specific needs, a technician of the field will have the possibility to apply several modifications to the previously described embodiments. It is clear that several omissions, substitutions, and modifications in the form and in the details, as other embodiments are possible; it is also expressly intended that specific elements and/or process steps described in relation to any embodiment of the invention described may be incorporated in any other embodiment as general aspect of design choices.

An embodiment of an integrated circuit described above may be a processor, and may be coupled to another integrate circuit (e.g., a processor) to form a system.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A wafer, comprising:
a plurality of integrated circuit device regions separated from each other by scribe lines;
wherein a first integrated circuit device region of said plurality of integrated circuit device regions includes a first seal ring at least partially surrounding a first circuit area and a first conductive pad that is electrically connected to the first seal ring;
wherein a second integrated circuit device region of said plurality of integrated circuit device regions includes a second seal ring at least partially surrounding a second circuit area and a second conductive pad that is electrically connected to the second seal ring; and
an electrical interconnection structure extending through the scribe line between the first and second integrated circuit device regions to electrically connect the first and second seal rings.

2. The wafer of claim 1, wherein the first conductive pad is configured to receive a first probe tip and the second conductive pad is configured to receive a second probe tip for testing alignment and the electrical interconnection structure is configured to pass a probe tip signal from the first conductive pad to the second conductive pad when the first and second probe tips are aligned with the first and second conductive pads, respectively.

3. The wafer of claim 1, wherein the first conductive pad is positioned between the first seal ring and one of the scribe lines.

4. The wafer of claim 1, wherein the first conductive pad is positioned in the first circuit area.

5. The wafer of claim 1, wherein the first conductive pad is positioned between the first seal ring and the electrical interconnection structure.

6. The wafer of claim 1, further comprising a third conductive pad positioned in the scribe line, said electrical interconnection structure being electrically connected to the third conductive pad.

7. The wafer of claim 1, further comprising a third conductive pad and a fourth conductive pad positioned in the scribe line, said electrical interconnection structure being electrically connected to both the third and fourth conductive pads.

8. The wafer of claim 1, wherein said electrical interconnection structure comprises:
a third conductive pad positioned in a corner of the first integrated circuit device region adjacent the scribe line, said third conductive pad electrically connected to the first seal ring;
a fourth conductive pad positioned in a corner of the second integrated circuit device region adjacent the scribe line, said fourth conductive pad electrically connected to the second seal ring; and
an electrical connection in the scribe line that electrically connects the third and fourth conductive pads.

9. The wafer of claim 8, wherein the electrical interconnection structure further comprises a diode.

10. The wafer of claim 1, wherein the electrical interconnection structure directly electrically connects the first and second seal rings.

11. The wafer of claim 10, wherein the electrical interconnection structure directly electrically connects to the first seal ring at a corner of the first seal ring.

12. The wafer of claim 11, wherein the corner of the first seal ring where the electrical interconnection structure makes the direct electrical connection includes a triangular reinforcement structure.

13. The wafer of claim 11, wherein the corner of the first seal ring where the electrical interconnection structure makes the direct electrical connection includes a square reinforcement structure.

14. The wafer of claim 1, wherein the first seal ring is a discontinuous structure having a first end and a second end, and wherein the first and second ends are formed by interdigitated structures.

15. A wafer, comprising:
a plurality of integrated circuit device regions separated from each other by scribe lines;
wherein a first integrated circuit device region of said plurality of integrated circuit device regions includes a first seal ring at least partially surrounding a first circuit area and a first conductive pad that that is electrically connected to the first seal ring;
wherein a second integrated circuit device region of said plurality of integrated circuit device regions includes a second seal ring at least partially surrounding a second circuit area and a second conductive pad that is electrically connected to the second seal ring; and
an electrical interconnection structure extending through the scribe line to electrically connect the first conductive pad to the second conductive pad.

16. The wafer of claim 15, wherein the first conductive pad is configured to receive a first probe tip and the second conductive pad is configured to receive a second probe tip for testing alignment and the electrical interconnection structure is configured to pass a probe tip signal from the first conductive pad to the second conductive pad when the first and second probe tips are aligned with the first and second conductive pads, respectively.

17. The wafer of claim 15, wherein the electrical interconnection structure further comprises a diode.

18. The wafer of claim 15, wherein the first seal ring is a discontinuous structure having a first end and a second end, and wherein the first and second ends are formed by interdigitated structures.

19. A wafer, comprising:
a plurality of integrated circuit device regions separated from each other by scribe lines;
wherein a first integrated circuit device region of said plurality of integrated circuit device regions includes a first seal ring at least partially surrounding a first circuit area and a first conductive pad that that is electrically connected to the first seal ring;
wherein a second integrated circuit device region of said plurality of integrated circuit device regions includes a second seal ring at least partially surrounding a second circuit area and a second conductive pad that is electrically connected to the second seal ring; and
an electrical interconnection structure extending through the scribe line to electrically connect the first seal ring to the second seal ring.

20. The wafer of claim 19, wherein the first conductive pad is configured to receive a first probe tip and the second conductive pad is configured to receive a second probe tip for testing alignment and the electrical interconnection structure is configured to pass a probe tip signal from the first conductive pad to the second conductive pad when the first and second probe tips are aligned with the first and second conductive pads, respectively.

21. The wafer of claim 19, wherein the electrical interconnection structure directly electrically connects to the first seal ring at a corner of the first seal ring.

22. The wafer of claim 21, wherein the corner of the first seal ring where the electrical interconnection structure makes the direct electrical connection includes a triangular reinforcement structure.

23. The wafer of claim 21, wherein the corner of the first seal ring where the electrical interconnection structure makes the direct electrical connection includes a square reinforcement structure.

24. The wafer of claim 19, wherein the first conductive pad is positioned between the first seal ring and one of the scribe lines.

25. The wafer of claim 19, wherein the first conductive pad is positioned in the first circuit area.

26. The wafer of claim 19, wherein the first conductive pad is positioned in the scribe line.

27. The wafer of claim 19, wherein the first seal ring is a discontinuous structure having a first end and a second end, and wherein the first and second ends are formed by interdigitated structures.

* * * * *